US012645069B2

(12) United States Patent
Haspeslagh et al.

(10) Patent No.: US 12,645,069 B2
(45) Date of Patent: Jun. 2, 2026

(54) HIGH ACCURACY TEMPERATURE-COMPENSATED PIEZORESISTIVE POSITION SENSING SYSTEM

(71) Applicant: ASML Netherlands B.V., Veldhoven (NL)

(72) Inventors: Luc Roger Simonne Haspeslagh, Linden (BE); Nitesh Pandey, Silicon Valley, CA (US); Ties Wouter Van Der Woord, Eindhoven (NL); Halil Gökay Yegen, Eindhoven (NL); Sebastianus Adrianus Goorden, Eindhoven (NL); Alexis Humblet, Liege (BE); Alexander Ludwig Klein, Eindhoven (NL); Jim Vincent Overkamp, Eindhoven (NL); Guilherme Brondani Torri, Leuven (BE); Edgar Alberto Osorio Oliveros, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 565 days.

(21) Appl. No.: 18/037,957

(22) PCT Filed: Nov. 8, 2021

(86) PCT No.: PCT/EP2021/080873
§ 371 (c)(1),
(2) Date: May 19, 2023

(87) PCT Pub. No.: WO2022/111975
PCT Pub. Date: Jun. 2, 2022

(65) Prior Publication Data
US 2024/0004184 A1 Jan. 4, 2024

(30) Foreign Application Priority Data

Nov. 30, 2020 (EP) ...................................... 20210516
Dec. 14, 2020 (EP) ...................................... 20213650

(51) Int. Cl.
G02B 26/08 (2006.01)
B81B 7/02 (2006.01)
G03F 7/00 (2006.01)

(52) U.S. Cl.
CPC ............ *G02B 26/0858* (2013.01); *B81B 7/02* (2013.01); *G03F 7/70116* (2013.01);
(Continued)

(58) Field of Classification Search
CPC ............ H10N 30/2042; G03F 7/70116; G03F 7/70291; G02B 21/10; G02B 26/0858;
(Continued)

(56) References Cited

U.S. PATENT DOCUMENTS 5,229,872 A 7/1993 Mumola
5,296,891 A 3/1994 Vogt et al.
(Continued)

FOREIGN PATENT DOCUMENTS

CN 110687675 A 1/2020
DE 102015211472 A1 7/2016
(Continued)

OTHER PUBLICATIONS

International Search Report and Written Opinion of the International Searching Authority directed to International Patent Application No. PCT/EP2021/080873, mailed May 12, 2022; 22 pages.
(Continued)

*Primary Examiner* — Deoram Persaud
(74) *Attorney, Agent, or Firm* — FINNEGAN, HENDERSON, FARABOW, GARRETT & DUNNER, LLP

(57) ABSTRACT

A micromirror array comprises a substrate, a plurality of mirrors for reflecting incident light and, for each mirror of the plurality of mirrors, at least one piezoelectric actuator for displacing the mirror, wherein the at least one piezoelectric actuator is connected to the substrate. The micromirror array further comprises one or more pillars connecting the mirror to the at least one piezoelectric actuator. Also disclosed is a method of forming such a micromirror array. The micromirror array may be used in a programmable illuminator. The programmable illuminator may be used in a lithographic apparatus and/or in an inspection and/or metrology apparatus.

15 Claims, 24 Drawing Sheets

(52) U.S. Cl.
CPC .... *G03F 7/70291* (2013.01); *B81B 2207/015* (2013.01); *B81B 2207/11* (2013.01)

(58) Field of Classification Search
CPC .............. G02B 7/008; B81B 2207/015; B81B 2207/11; B81B 7/02
See application file for complete search history.

(56) References Cited

U.S. PATENT DOCUMENTS

| | | | |
|---|---|---|---|
| 5,523,193 A | 6/1996 | Nelson | |
| 8,294,877 B2 | 10/2012 | Wangler et al. | |
| 8,724,200 B1 | 5/2014 | Wu | |
| 9,946,167 B2 | 4/2018 | Smilde et al. | |
| 10,254,654 B2 | 4/2019 | Palmer et al. | |
| 2002/0131682 A1* | 9/2002 | Nasiri | B81B 3/0062 |
| | | | 385/18 |
| 2005/0274193 A1 | 12/2005 | Kwon et al. | |
| 2006/0066964 A1* | 3/2006 | Greywall | G02B 26/0841 |
| | | | 359/849 |
| 2009/0128886 A1* | 5/2009 | Hirota | G03F 7/70083 |
| | | | 359/239 |
| 2014/0211187 A1* | 7/2014 | Hauf | G03F 7/70075 |
| | | | 359/848 |
| 2014/0327895 A1* | 11/2014 | Waldis | G03F 7/70291 |
| | | | 359/849 |
| 2015/0241196 A1* | 8/2015 | Gerson | G02B 26/101 |
| | | | 73/788 |
| 2017/0131162 A1* | 5/2017 | Jutzi | G02B 26/0833 |
| 2017/0363861 A1* | 12/2017 | Hauf | G01C 9/06 |
| 2018/0194014 A1 | 7/2018 | Bibl et al. | |
| 2020/0192199 A1* | 6/2020 | Boni | G02B 26/0858 |
| 2023/0159323 A1* | 5/2023 | Naiki | G02B 26/0841 |
| | | | 359/224.1 |
| 2023/0273423 A1* | 8/2023 | Linder | B81C 1/00666 |
| | | | 359/221.2 |
| 2024/0012332 A1* | 1/2024 | Haspeslagh | G02B 5/1861 |

FOREIGN PATENT DOCUMENTS

| | | |
|---|---|---|
| TW | 200815786 A | 4/2008 |
| WO | WO 98/33096 A1 | 7/1998 |
| WO | WO 98/38597 A2 | 9/1998 |
| WO | WO 2021/032483 A1 | 2/2021 |

OTHER PUBLICATIONS

International Preliminary Report on Patentability directed to International Patent Application No. PCT/EP2021/080873, issued May 30, 2023; 16 pages.

* cited by examiner

1200

1201

1203

1202

1200

1201

1203

1202

HIGH ACCURACY TEMPERATURE-COMPENSATED PIEZORESISTIVE POSITION SENSING SYSTEM

CROSS-REFERENCE TO RELATED APPLICATIONS

This application claims priority of EP application 20210516.9 which was filed on 30 Nov. 2020, and EP application 20213650.3 which was filed on 14 Dec. 2020, and which are incorporated herein in its entirety by reference.

FIELD

The present invention relates to a microelectromechanical system, a programmable illuminator comprising such a microelectromechanical system being a micromirror array, a lithographic apparatus comprising such a programmable illuminator, an inspection and/or metrology apparatus comprising such a programmable illuminator and a method for forming such a microelectromechanical system.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device onto a layer of radiation-sensitive material (resist) provided on a substrate. The term "patterning device" as employed in this text should be broadly interpreted as referring to a device that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device. Examples of such patterning devices include:

A mask (or reticle). The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. The mask may be supported by a support structure such as a mask table or mask clamp. This support structure ensures that the mask can be held at a desired position in the incoming radiation beam, and that it can be moved relative to the beam if so desired;

A programmable mirror array. One example of such a device is a matrix-addressable surface having a viscoelastic control layer and a reflective surface. The basic principle behind such a device is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis, for example by applying a suitable localized electric field, or by employing electrostatic or piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning means can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference. Such a programmable mirror array may be supported by a support structure such as a frame or table, for example, which may be fixed or movable as required; and A programmable LCD array. An example of such a construction is given in U.S. Pat. No. 5,229,872, which is incorporated herein by reference. Such a programmable LCD array may be supported by a support structure such as a frame or table, for example, which may be fixed or movable as required.

For purposes of simplicity, the rest of this text may, at certain locations, specifically direct itself to examples involving a mask and a mask table; however, the general principles discussed in such instances should be seen in the broader context of the patterning means as hereabove set forth.

To project a pattern on a substrate a lithographic apparatus may use electromagnetic radiation (here referred to often as simply "light", though the wavelength may not be in the visible range). The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Besides the wavelength (a) of the radiation and the Numerical Aperture (NA) of the projection lens, the shape, or more generally the angular intensity distribution, of the illumination source is one of the most important parameters in enabling high resolution in lithography.

A micromirror array, comprising an array of hundreds or thousands of micromirrors (often referred to below simply as "mirrors"), can be used in the illumination system of a lithographic apparatus to control the cross-sectional shape and intensity distribution of the light. Each micromirror reflects a spot of light and changing the angles of the micromirrors changes the positions of the spots and thus changes the shape of the radiation beam.

Microelectromechanical systems (MEMS) technology may be used to manufacture and control the mirrors. For example, an electrostatic or piezoelectric MEMS system may be used to angle the mirrors.

Currently micromirror arrays exist for shaping light having a wavelength in the deep ultraviolet spectrum (DUV), e.g. $\lambda=193$ nm. However, these micromirror arrays cannot be effectively used at shorter wavelengths as required for light in the extreme ultraviolet spectrum (EUV), e.g. λ=13.5 nm. New micromirror array technology is required for use with EUV radiation. Also, advantageous new applications for this new micromirror array technology are desired, for use with EUV and/or non-EUV radiation, e.g. visible light or DUV radiation.

PCT patent application PCT/EP2020/072005 (which was not published at the priority date of the present application) discloses a micromirror array which uses piezoelectric actuators to control the angles of mirrors in a micromirror array. The mirrors are provided in a MEMS wafer, and control signals for each mirror are transmitted to the MEMS wafer from a control circuit using, for each mirror, a respective plurality of through silicon vias, TSV.

SUMMARY

According to a first aspect of the present invention there is provided a microelectromechanical system, MEMS (e.g. a micromirror array), which for example may be used in the illumination system of a lithographic apparatus or an inspection and/or metrology apparatus to condition a radiation beam. The microelectromechanical system comprises a substrate and a plurality of MEMS elements (e.g. mirrors) for reflecting incident light and supported from the substrate. For each MEMS element, there is at least one piezoelectric actuator for displacing the MEMS element connected to the substrate. The microelectromechanical system further comprises a control system arranged to receive a control signal from outside the microelectromechanical system, and to generate one or more actuator control signals based on the received control signal. The actuator control signals are transmitted to the corresponding actuators, so that the control system controls each of the MEMS elements individually.

Each of the MEMS elements is also provided with at least one piezoresistor sensing element for generating an analogue sensor signal indicative of displacement of the MEMS element, and a temperature sensor for generating an analogue temperature signal indicative of the temperature of the piezoresistor sensing element. The sensing element can allow accurate determination of the MEMS element position (e.g. tip and tilt angles), which may be important for providing feedback to the piezoelectric actuators. For example, the sensing element may comprise a piezoresistor arranged so that displacement of the MEMS element causes the piezoresistor to deflect (that is, be deformed). The voltage output from the piezoresistor may be proportional to the displacement of the MEMS element.

The control system uses the analogue sensor signals and the analogue temperature signals respectively to generate corresponding digital sensor signals and corresponding digital temperature signals. Using the received control signal, the digital sensor signals and digital temperature signals, the control system calculates target actuator control voltages, and then generates the actuator control signals based on the calculated target actuator control voltages (e.g. as actuator control signals having a voltage equal to the target actuator control voltage).

Because the calculation is carried out on digital signals, the calculation of the actuator control signals is much more straightforward than attempting to do this using analogue signals would be. Furthermore, a more sophisticated calculation can be performed, in which for example the dependence of the target actuator control signals includes not only a linear ($1^{st}$ order) dependence on the digital temperature signal but preferably also a $2^{nd}$ and/or $3^{rd}$ order dependence on the digital temperature signal. It has found that the accuracy of determining the flexing of the MEMS element in the present arrangement is 40 parts per million (ppm), whereas a pre-existing system would typically achieve an accuracy of about 0.1%. Thus, there may an improvement in accuracy by a factor of about 25.

The calculation may include modeling the strain in the temperature sensor. In this model, the temperature value indicated by the digital temperature signal is corrected to compensate for strain in the temperature sensor, which influences the output of the temperature sensor. The correction is performed using the digital sensor signal, and may include $1^{st}$, $2^{nd}$ and/or $3^{rd}$ order dependency on the digital sensor signal.

Similarly, the calculation may include modeling an estimated temperature value representing the temperature in the piezoresistor sensing element. In this model the strain value indicated by the digital sensor signal is corrected to compensate for the temperature in the piezoresistor sensing element, which influences the digital sensor signal. The correction is performed using the digital temperature signal, and may include 1st, 2nd and/or 3rd order dependency on the digital temperature signal.

The control system may include an electrical bridge element, of the kind including two voltage supply terminals maintained at different respective voltages, input and output terminals, and multiple resistors (e.g. all having the same resistance value) connected between corresponding pairs of the terminals. For example, there may be three resistors: two respectively connected between the voltage supply terminals and the output terminal, and one between the input terminal and one of the voltage terminals.

The piezoresistor sensing element is electrically connected between one of the voltage supply terminals and the input terminals, so that the piezoresistor sensing element transmits a sensor signal to the electrical bridge element. Strain in the piezoresistor sensing element will modify the resistance of the piezoresistor sensing element, and that will result in a modified voltage (signal) difference between input and output terminals of the bridge. The voltage between the input and output terminals may be passed to an analogue-to-digital converter (ADC), which generates the digital sensor signal by digitizing the difference between input and output signals of the bridge.

The temperature of the electrical bridge element too may influence the modified sensor signal, so the electrical bridge element preferably comprises at least one bridge temperature sensor (e.g. at least one sensor per resistor) arranged to generate a bridge temperature signal indicative of the temperature of at least one of the resistors. The bridge temperature signal(s) are converted to a digital bridge temperature signal by the ADC, and used in the calculation of the target actuator control voltages.

The electrical bridge element and/or the ADC may be part of a control unit such as an integrated circuit, which may be an application-specific integrated circuit (ASIC). The control unit may be proximate the actuator, e.g. at the same height in the microelectromechanical system, where height is defined perpendicular to a horizontal plane, which may be defined as a plane of the substrate or a plane of the MEMS elements (e.g. a plane of the mirrors). For example, the control unit may be provided on the same wafer as the actuator(s).

By contrast, the control system may comprise at least one controller unit, which is an integrated circuit mounted on the substrate and arranged to calculate the target actuator control voltages. The controller unit may be an integrated circuit on the surface of the substrate facing away from the MEMS elements and connected to the control units by vias which pass through the substrate. Optionally, there may be one control unit per MEMS element, and optionally there may be more than one controller per control unit, e.g. a single controller for calculating the target actuator control voltages for all the control units.

The temperature sensor may be provided in the form of a bipolar transistor. A base and a collector of the bipolar transistor may be electrically connected so that the bipolar transistor operates as a diode.

The piezoresistor sensing element may be provided on a strip of flexible material (sensing beam) anchored at one end to the substrate. The piezoresistor sensing element may be in the form of two adjacent elongate bodies of piezoelectric material, such as a folded piezoresistor. The temperature sensor may be provided between the bodies of piezoelectric material. Due to the close proximity of the piezoresistor sensing element and temperature sensors, any temperature difference between them is very small. The piezoresistor sensing element and temperature sensors are preferably placed as close as possible to the anchor point to limit the temperature swing during measurement.

The temperature sensor and piezoresistor may be formed as embedded layers in a one-piece semiconductor body, such as the strip of flexible material.

The piezoelectric actuator(s) for each MEMS element may also be implemented using a strip of flexible material. Indeed, this may be the strip of flexible material in which the temperature sensor and piezoresistor are formed. To form the piezoelectric actuator the strip may carry at least one piezoelectric layer and electrodes for applying the generated actuator control signals to the piezoelectric layer. The piezoresistor may have one (fixed) end connected to the substrate and another (moving) end connected to one or more of a mirror or displacement structure of the MEMS element, the piezoelectric actuator, or a pillar which connects the piezoelectric actuator to the mirror or displacement structure.

The strip and the layer of piezoelectric material may form a cantilever, anchored to the substrate at one (fixed relative to the substrate) end and connected to a mirror or displacement structure of the MEMS element via the pillar at the opposite (moving) end. Alternatively, the pillars may be connected directly to another structure on the MEMS elements (e.g. a flexible substrate, a multilayer reflector, or a pellicle border) in order to deform said structure by displacing the MEMS element. By applying a voltage to the layer of piezoelectric material, the layer can expand or contract and thereby stress the strip and cause it to bend. Each piezoelectric actuator may also comprise a hinge connected to an end of the strip and to the pillar. The hinge has a smaller cross section than the strip in the elongation direction of the strip (i.e. the cross section looking end-on at the strip). For example, the hinge may be formed from the same material as the strip of flexible material (typically silicon), but be patterned to have a smaller cross section to increase its flexibility and thereby cause it to act as a hinge between the strip and the pillar. The reduced cross-sectional area can also decrease the thermal conductivity of the hinge compared to the strip of flexible material, which may therefore be advantageous in preventing heating of the piezoelectric actuator. The pillar may comprise a thermally isolating layer (e.g. oxide) to reduce or prevent heat transfer to the piezoelectric actuator (e.g. from a mirror). The pillar may also be configured to electrically isolate the mirror or displacement structure from the piezoelectric actuator. This may prevent charge build up on the mirror or displacement structure from affecting the piezoelectric actuator. The flexible strip acts as a thermal resistor between the high temperature mirror and the low temperature anchor.

Preferably, the microelectromechanical system includes four piezoelectric actuators for each MEMS element, arranged so as to enable tip and tilt displacement control of the MEMS element.

The microelectromechanical system may also comprise, for each MEMS element, a heat diffuser for diffusing heat from the MEMS element. In use, the microelectromechanical system may absorb some energy from incident light, which increases the temperature of the device. This increase in temperature can decrease device performance. Typically, the microelectromechanical system, such as a micromirror array, is intended to operate in environment with a gas pressure far less than one atmosphere, in fact typically substantially in a vacuum, so heat convection is substantially zero. Instead, the heat diffuser allows heat to be conducted away, such as to the substrate. Typically, the heat diffuser comprises a flexible element connected between the MEMS element and the substrate and arranged to flex as the MEMS element is moved. Note that there is a trade-off between increased flexibility of the heat diffuser, and increased ability for the heat diffuser to conduct heat away from the MEMS element. Using piezoelectric actuator(s) allows increased force to be applied to the flexible element, in turn allowing the heat diffuser to be selected to provide improved thermal conductivity.

In one example, the heat diffuser may comprise a heat sink and a thermally conductive post connecting the heat sink to the MEMS element. The heat sink may comprise a flexible membrane, which allows the post to pivot when the MEMS element is displaced. The flexible membrane can be a patterned silicon layer, which has the advantage of being readily available in a CMOS manufacturing process, without requiring further masks or process steps. The flexible membrane can comprise grooves through the flexible membrane and extending from an outer edge of the heat sink towards the thermally conductive post. The grooves, which may be curved grooves, increase the flexibility of the membrane so as to not impede motion of the MEMS element. The piezoelectric actuators of preferred embodiments are selected to provide a level of force which is greater than the electrostatic actuators used in some conventional systems, and which is sufficient to deform the flexible member even though it has sufficient cross-sectional area (for example, as measured at the intersection of the flexible member with a circular-cylindrical surface with an axis coinciding with an axis of the post) to permit greater heat diffusion than that provided for conventional mirror arrays. This allows the present microelectromechanical system to be used in applications for which the conventional mirror arrays would be unsuitable.

The heat sink may comprise a layer of metal, such as aluminum, which has a higher thermal conductivity compared to silicon. The layer of metal can also protect the heat sink from plasma. The thermally conductive post may also be electrically conductive and connected to ground, so as to prevent charge build up on the MEMS element, which may otherwise impede displacement control of the MEMS element.

A microelectromechanical system may be a micromirror array, wherein each MEMS element of the plurality of MEMS elements is associated with a mirror for reflecting incident light. Each mirror in the array is preferably suitable for reflecting light having a wavelength in the range of about 13 nm, such as a narrow range centered substantially on 13.5 nm. This enables the micromirror to be used with a lithographic apparatus operating in the extreme ultraviolet (EUV) spectrum.

Apart from the micromirror array, the microelectromechanical system, MEMS, may be used in other parts of a lithographic apparatus and/or an inspection and/or metrology apparatus. For example, the MEMS may be used with a single (macro) mirror by locating the plurality of MEMS elements underneath and deforming the mirror surface. Accordingly, the MEMS may further comprise a continuous reflective layer, wherein displacement of the MEMS elements causes the continuous reflective layer to be deformed in order to redirect light incident on the continuous reflective layer. The reflective layer can be a multilayer reflector, for example when used in a patterning device or in a normal incidence mirror, or may be a single metal foil, for example when used in a grazing incidence mirror.

The MEMS elements can in some instances be directly bonded to the continuous reflective layer or to a continuous substrate on which the continuous reflective layer is located (for example, the pillars directly attached to the piezoelectric actuators can be directly bonded to the back of the reflective layer). Alternatively, each MEMS element may comprise a displacement structure for supporting the continuous reflective layer and for translating displacements of the one or more piezoelectric actuators to the continuous reflective layer. The displacement structure may be formed in a separate wafer and bonded to the other part of the MEMS. The displacement structure may be a rectangular layer or block, which is tipped and tilted when displaced by the piezoelectric actuators. Other shapes of the displacement structure are also of course possible (e.g. hexagonal in the horizontal plane), depending on the type of deformation of the overlying structure that is required.

According to a second aspect of the present invention there is provided a programmable illuminator that comprises a microelectromechanical system being a micromirror array according to the first aspect of the present invention for conditioning a radiation beam.

The programmable illuminator may further comprise a displacement control feedback system configured to determine for each mirror in the micromirror array a position of the mirror and to adjust a voltage applied to the associated piezoelectric actuators based on the determined position and based on a predefined target position of the mirror. The performance of the piezoelectric actuators may change over time, so that the initial calibration of displacement to applied voltage is no longer valid, and the displacement control feedback system can be used to adapt applied voltage based on the measured mirror position. The feedback system may comprise or make use of the sensing element of the micromirror array to determine the mirror position.

According to a third aspect of the present invention there is provided a lithographic apparatus arranged to project a pattern from a patterning device onto a substrate. The lithographic apparatus comprises a programmable illuminator according to the second aspect of the present invention for conditioning a radiation beam used to illuminate the patterning device and/or for conditioning a radiation beam used to measure a target structure on the substrate. The micromirror array in the programmable illuminator may be used in an illumination system of a lithographic apparatus for example to control or condition a cross-sectional shape and/or intensity distribution of the light or radiation beam that is used to illuminate the patterning device. Alternatively or in addition, the micromirror array in the programmable illuminator may be used in an alignment system and/or overlay measurement system, respectively, of the lithographic apparatus to control or condition a spectral and/or spatial distribution of the light or radiation beam that is used to measure a position of an alignment mark(er) or target structure on the substrate and/or to perform an overlay measurement of a mark(er) or target structure on the substrate, respectively.

According to a fourth aspect of the present invention there is provided an inspection and/or metrology apparatus that comprises a programmable illuminator according to the second aspect of the present invention for conditioning a radiation beam used to measure a target structure on a substrate. For example, the micromirror array in the programmable illuminator may be used to control or condition a spectral and/or spatial distribution of the light or radiation beam that is used by the inspection and/or metrology apparatus to measure a target structure, e.g. a mark(er), on the substrate in order to determine the position of that target structure for alignment purposes and/or in order to perform an overlay measurement.

According to a fifth aspect of the present invention there is provided lithographic apparatus arranged to operate in a dark-field imaging mode when projecting a pattern from a patterning device onto a substrate. The apparatus comprises a patterning device (which may alternatively be referred to as a mask or a reticle) comprising a first MEMS according to the first aspect of the invention, wherein the first MEMS comprises a continuous reflective layer such as a multilayer reflector provided with a pattern for patterning the incident radiation beam. The apparatus further comprises a mirror for projecting the pattern from the patterning device and comprising a second MEMS according to the first aspect (e.g. a micromirror array), wherein the mirror comprises an opening arranged to let through the radiation beam used to illuminate the patterning device. The opening allows the radiation beam to have normal incidence on the patterning device. The first MEMS is configured to redirect a first order diffraction from the patterning device, which would otherwise fall inside the opening, and onto the mirror. The second MEMS is configured to compensate for the redirection so as to correct the projected pattern. The diffraction angle at any one point on the patterning device depends on the density or pitch of features of the patterning device at that point. A large pitch gives a small diffraction angle and requires a larger deformation of the surface of the patterning device to redirect the first order diffraction onto the mirror. The first MEMS can be pre-set to provide the appropriate local deformation across the patterning device and may then remain fixed throughout the patterning/scanning process. The second MEMS (i.e. the MEMS on the projection mirror) needs to dynamically update the displacements of the MEMS elements as the radiation beam is scanned across the patterning device in order to correctly compensate for the local deformation of the patterning device where the radiation beam is incident.

According to a sixth aspect of the present invention there is provided a mask assembly, comprising a pellicle (a thin film) arranged to protect a surface of a patterning device from contamination, and a pellicle frame configured to support the pellicle and configured to fix the pellicle relative to the patterning device. The frame comprises a MEMS according to the first aspect of the invention, and the MEMS is configured to displace part of the pellicle so as to apply stress to the pellicle. The MEMS can displace a border area/portion of the pellicle to increase the stress, which can prevent the film from slacking and requiring replacement thereby prolonging the lifetime of the pellicle and mask assembly. Sensors in the MEMS elements can be used to determine the stress in the pellicle, and the MEMS elements can be individually controlled to apply stress locally across different sections of the pellicle.

According to a seventh aspect of the present invention, there is provided a lithographic apparatus arranged to project a pattern from a patterning device onto a substrate, the lithographic apparatus comprising a mask assembly according to the sixth aspect of the invention.

According to an eighth aspect of the present invention there is provided a grazing incidence mirror for reflecting light having an angle of incidence in the range of about 75° to 89°. The mirror comprises a MEMS according to the first aspect of the invention. The MEMS can comprise micromirrors or preferably a continuous reflective layer such as a metal foil. The continuous layer can prevent incident radiation from being scattered from the edges of the micromirrors and can also prevent plasma formation in the gaps and underneath the micromirrors.

According to a ninth aspect of the present invention there is provided a collector for collecting light from a light source to form a radiation beam. The collector comprises a plurality of grazing incidence mirrors according to the eighth aspect of the present invention.

According to a tenth aspect of the present invention there is provided an inspection and/or metrology apparatus comprising a grazing incidence mirror according to the eighth aspect of the present invention, the grazing incidence mirror being configured to allow adjustment of a focus of a radiation beam on a substrate such as a wafer.

According to an eleventh aspect of the present invention there is provided a method of controlling a microelectromechanical system according to the first aspect of the present invention. The method of controlling comprises calculating target actuator control voltages using a control signal received from outside the MEMS (e.g. via a communication interface of the controller), and the digital sensor signals and digital temperatures, and generating the actuator control signals based on the calculated target actuator control voltages. The MEMS is typically a micromirror array, but may alternatively be part of a single (macro) mirror, or a pellicle frame.

According to a twelfth aspect of the present invention there is provided a method of forming a microelectromechanical system. The method may be used to form a MEMS according to the first aspect of the present invention. The method of forming a MEMS comprises: providing a substrate, forming a plurality of MEMS elements and for each MEMS element, forming at least one piezoelectric actuator for displacing the MEMS element and connected to the substrate. The method may further comprise forming one or more pillars for connecting the at least one piezoelectric actuator to a mirror or a displacement structure.

BRIEF DESCRIPTION OF THE DRAWINGS

Embodiments of the invention will now be described, by way of example only, with reference to the accompanying schematic drawings, in which.

DETAILED DESCRIPTION

Figure 1:
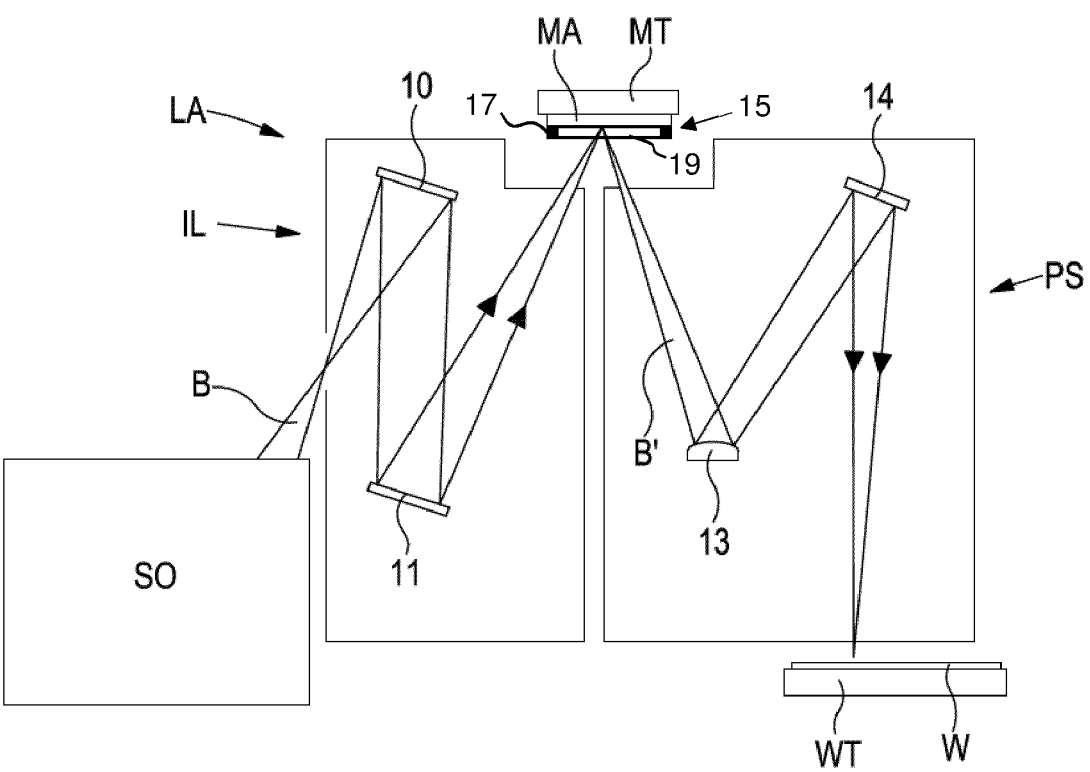
FIG. 1 depicts a lithographic system comprising a lithographic apparatus with a (programmable) illuminator and a radiation source.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure or mask table MT configured to support a mask assembly 15 comprising a patterning device MA, a projection system PS and a substrate table WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The radiation beam B passes from the illumination system IL and is incident upon the mask assembly 15 held by the support structure MT. The mask assembly 15 includes a patterning device MA and, optionally, a pellicle 19, which, if present, is held in place by a pellicle frame 17. The patterning device MA reflects and patterns the radiation beam B'. The illumination system IL may include other mirrors or devices in addition to, or instead of, the faceted field mirror device 10 and/or the faceted pupil mirror device 11. For example, a micromirror array as described herein may be added to the illumination system IL in addition to the facetted field mirror device 10 and faceted pupil mirror device 11 as disclosed in U.S. Pat. No. 8,294,877 B2, which is hereby incorporated in its entirety by reference, or may be used to replace one or both of the faceted field mirror device 10 and the faceted pupil mirror device 11 as disclosed in U.S. Pat. No. 10,254, 654 B2, which is hereby incorporated in its entirety by reference. In that case the illumination system IL, which now includes at least one micromirror array as described herein, is a programmable illuminator IL. Such a programmable illuminator IL may be used for conditioning a radiation beam used to illuminate the patterning device. For example, the programmable illuminator IL may be used to control or condition the EUV radiation beam B by providing it with a desired cross-sectional shape and/or a desired intensity distribution.

After being thus conditioned, the EUV radiation beam B illuminates the patterning device MA and interacts with it. As a result of this interaction, a patterned EUV radiation beam B' is generated. The projection system PS is configured to project the patterned EUV radiation beam B' onto the substrate W. For that purpose, the projection system PS may comprise a plurality of mirrors 13,14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13,14 in FIG. 1, the projection system PS may include a different number of mirrors (e.g. six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO may be a laser produced plasma (LPP) source, a discharge produced plasma (DPP) source, a free electron laser (FEL) or any other radiation source that is capable of generating EUV radiation.

In order to separate the optics in the illumination system IL (i.e. optics before the pattering device MA) and the optics of the projection system PS (i.e. the optics after the patterning device MA), a so called chief ray angle of optics (CRAO) may be used, such that the radiation beam B is incident on the patterning device MA at an angle.

Figure 1A:
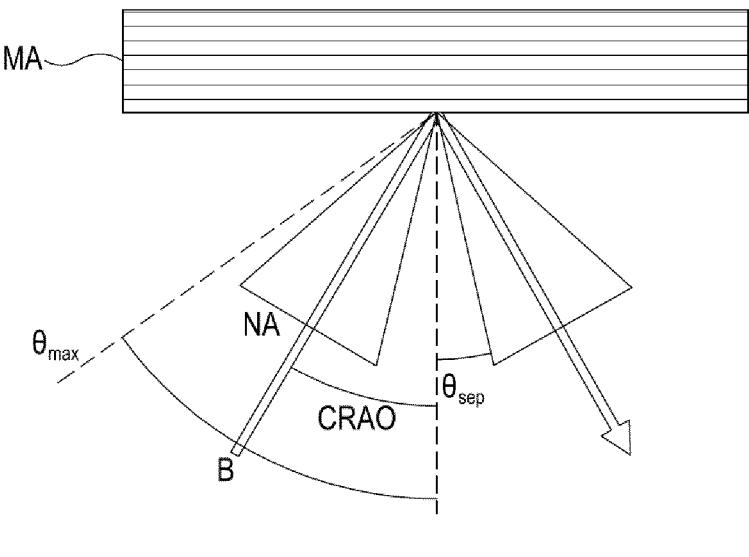
FIG. 1a depicts a part of a lithographic apparatus.

FIG. 1*a* shows a part of a lithographic apparatus, such as the lithographic apparatus LA of FIG. 1, wherein the radiation beam B is incident on the patterning device MA. The patterning device is typically a mask (e.g. a binary, alternating phase-shift, or attenuated phase-shift mask) on a multilayer reflector. The multilayer reflector typically comprises alternating layers of e.g. Mo or Ru and Si. The layer thicknesses is determined by the target wavelength (e.g. 13.5 nm for EUV) so as to maximize the reflectivity at that wavelength and thereby optimize overall throughput. The reflectivity of the multilayer reflector has an angular dependence, which needs to be taken into account when used for lithography.

The radiation beam is generally a conditioned radiation beam B that has been conditioned by optics of the illumination system IL (e.g. mirrors 10 and 11 of FIG. 1). The radiation beam B is incident on the patterning device MA at an angle within the numerical aperture NA centered on the CRAO. The patterning device MA has to reflect over a large angular bandwidth, to support the NA. If the angle of incidence is too large, then the patterning device MA may not accurately reflect the radiation beam B. Therefore, the angular bandwidth of the patterning device limits the maximum NA achievable at the patterning device MA.

Figure 1B:
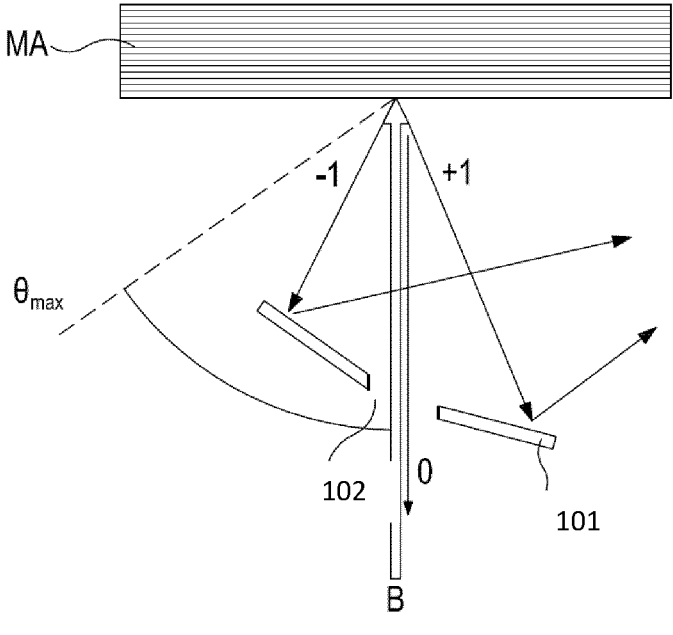
FIG. 1b shows a part of a lithographic apparatus configured for dark-field imaging.

FIG. 1*b* shows a part of a lithographic apparatus, such as the lithographic apparatus LA of FIG. 1, with an alternative configuration for separating the optics in the illumination system IL and the optics of the projection system PS using dark-field imaging. In this configuration, the radiation beam B has substantially normal incidence on the patterning device MA, which can therefore reduce the requirements on the angular bandwidth of the patterning device MA compared to CRAO. The first mirror 101 of the projection optics comprises an opening 102 for letting the radiation beam B through. The radiation beam B is diffracted by the patterning device MA, with the zeroth order diffraction sent back through the opening 102 into the illuminator (not shown). Higher order diffractions, such as the +1 and −1 diffraction orders are incident on the mirror 101 outside the opening 102 and can be projected onto the wafer (not shown) via the projection system PS.

As was described briefly above, the mask assembly 15 may include a pellicle 19 that is provided adjacent to the patterning device MA. The pellicle 19, if present, is provided in the path of the radiation beam B such that radiation beam B passes through the pellicle 19 both as it approaches the patterning device MA from the illumination system IL and as it is reflected by the patterning device MA towards the projection system PS. The pellicle 19 may comprise a thin film that is substantially transparent to EUV radiation (although it will absorb a small amount of EUV radiation). By EUV transparent pellicle or a film substantially transparent for EUV radiation herein is meant that the pellicle 19 is transmissive for at least 65% of the EUV radiation, preferably at least 80% and more preferably at least 90% of the EUV radiation. The pellicle 19 acts to protect the patterning device MA from particle contamination.

Whilst efforts may be made to maintain a clean environment inside the lithographic apparatus LA, particles may still be present inside the lithographic apparatus LA. In the absence of a pellicle 19, particles may be deposited onto the patterning device MA. Particles on the patterning device MA may disadvantageously affect the pattern that is imparted to the radiation beam B and therefore the pattern that is transferred to the substrate W. The pellicle 19 advantageously provides a barrier between the patterning device MA and the environment in the lithographic apparatus LA in order to prevent particles from being deposited on the patterning device MA.

The pellicle 19 is positioned at a distance from the patterning device MA that is sufficient that any particles that are incident upon the surface of the pellicle 19 are not in a field plane of the lithographic apparatus LA. This separation between the pellicle 19 and the patterning device MA acts to reduce the extent to which any particles on the surface of the pellicle 19 impart a pattern to the radiation beam B that is imaged onto the substrate W. It will be appreciated that where a particle is present in the beam of radiation B, but at a position that is not in a field plane of the beam of radiation B (i.e., not at the surface of the patterning device MA), then any image of the particle will not be in focus at the surface of the substrate W. In the absence of other considerations it may be desirable to position the pellicle 19 a considerable distance away from the patterning device MA. However, in practice the space which is available in the lithographic apparatus LA to accommodate the pellicle is limited due to the presence of other components. In some embodiments, the separation between the pellicle 19 and the patterning device MA may, for example, be approximately between 1 mm and 10 mm, for example between 1 mm and 5 mm, more preferably between 2 mm and 2.5 mm.

Figure 1C:
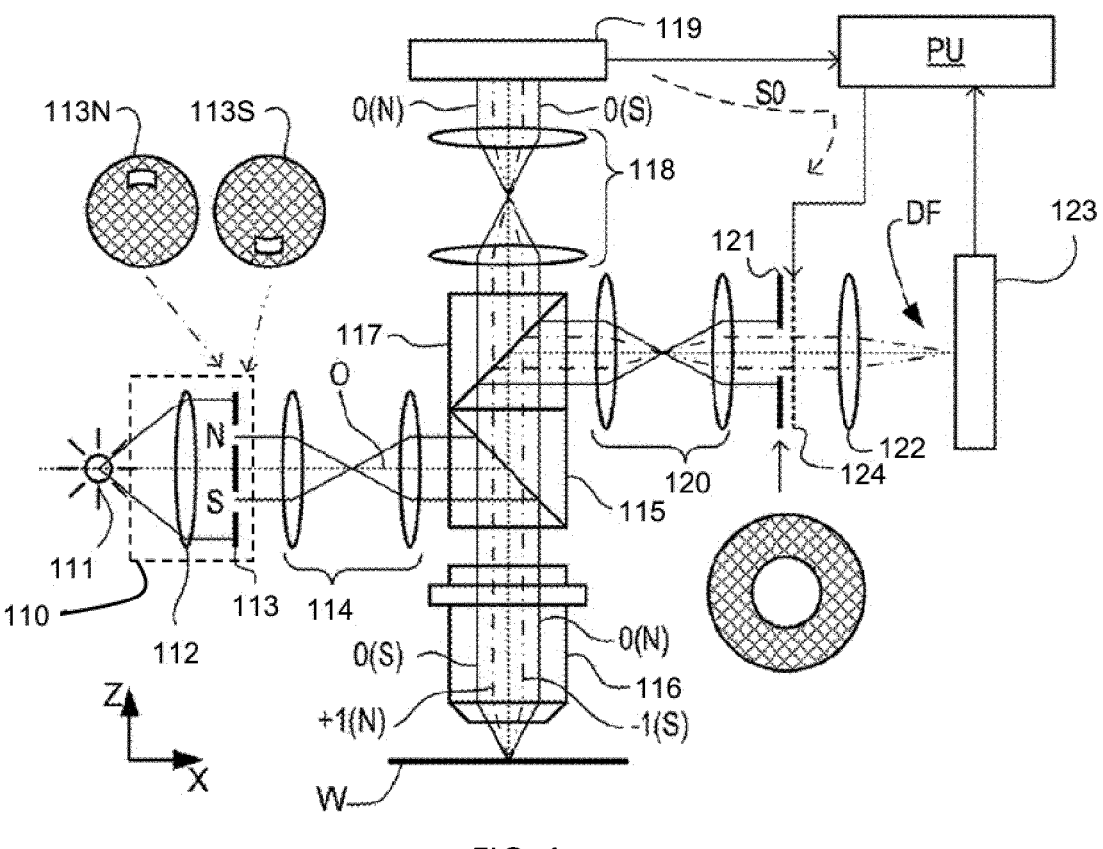
FIG. 1c depicts a known inspection and/or metrology apparatus.

FIG. 1c shows an inspection and/or metrology apparatus that is known from U.S. Pat. No. 9,946,167 B2, which is hereby incorporated in its entirety by reference. FIG. 1c corresponds to FIG. 3a of U.S. Pat. No. 9,946,167 B2. The inspection and/or metrology apparatus is a dark field metrology apparatus for measuring e.g. overlay and/or alignment.

In lithographic processes, it is desirable to frequently make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device and alignment, i.e. the position of alignment marks on the substrate. Various forms of scatterometers have been developed for use in the lithographic field. These devices direct a beam of radiation onto a target structure, e.g. a grating or mark(er), and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target structure by iterative approaches such as rigorous coupled wave analysis or finite element methods; library searches; and principal component analysis.

The dark field metrology apparatus shown in FIG. 1c may be a stand-alone device/system or may be incorporated in the lithographic apparatus LA as an alignment system and/or as an overlay measurement system (not shown). An optical axis, which has several branches throughout the apparatus, is represented by a dotted line O. In this apparatus, light emitted by radiation source 111 (e.g., a xenon lamp) is directed onto a substrate W via a beam splitter 115 by an optical system comprising lenses 112, 114 and objective lens 116. These lenses are arranged in a double sequence of a 4F arrangement. Therefore, the angular distribution at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 113 of suitable form between lenses 112 and 114, in a plane which is a back-projected image of the objective lens pupil plane. In the example illustrated, aperture plate 113 has different forms, labeled 113N and 1135, allowing different illumination modes to be selected. The illumination system in the present example forms an off-axis illumination mode. In the first illumination mode, aperture plate 113N provides off-axis from a direction designated, for the sake of description only, as 'north'. In a second illumination mode, aperture plate 1135 is used to provide similar illumination, but from an opposite direction, labeled 'south'. Other modes of illumination are possible by using different apertures. The rest of the pupil plane is desirably dark, as any unnecessary light outside the desired illumination mode will interfere with the desired measurement signals.

A target structure (not shown), e.g. a grating or mark(er), on substrate W is placed normal to the optical axis O of objective lens 116. A ray of illumination impinging on the target structure from an angle off the axis O gives rise to a zeroth diffraction order ray and two first diffraction order rays. Since the aperture in plate 113 has a finite width (necessary to admit a useful quantity of light) the incident rays will in fact occupy a range of angles, and the diffracted rays 0 and +1/−1 will be spread out somewhat. According to the point spread function of a small target, each order +1 and −1 will be further spread over a range of angles, not a single ideal ray. Note that the grating pitches and illumination angles can be designed or adjusted so that the first order rays entering the objective lens are closely aligned with the central optical axis.

At least the 0 and +1 orders diffracted by the target on substrate W are collected by objective lens 116 and directed back through beam splitter 115. Both the first and second illumination modes are illustrated, by designating diametrically opposite apertures labeled as north (N) and south (S). When the incident ray is from the north side of the optical axis, that is when the first illumination mode is applied using aperture plate 113N, the +1 diffracted rays, which are labeled +1(N), enter the objective lens 116. In contrast, when the second illumination mode is applied using aperture plate 113S the −1 diffracted rays (labeled −1(S) are the ones which enter the lens 116.

A second beam splitter 117 divides the diffracted beams into two measurement branches. In a first measurement branch, optical system 118 forms a diffraction spectrum (pupil plane image) of the target on first sensor 119 (e.g. a CCD or CMOS sensor) using the zeroth and first order diffractive beams. Each diffraction order hits a different point on the sensor, so that image processing can compare and contrast orders. The pupil plane image captured by sensor 119 can be used for focusing the inspection and/or metrology apparatus and/or normalizing intensity measurements of the first order beam. The pupil plane image can also be used for many measurement purposes such as reconstruction.

In the second measurement branch, an optical system including lenses 120, 122 forms an image of the target on the substrate W on sensor 123 (e.g. a CCD or CMOS sensor). In the second measurement branch, an aperture plate referred to as field stop 121 is provided in a plane that is conjugate to the pupil-plane. This plane will be referred to as an 'intermediate pupil plane' when describing the invention. Field stop 121 functions to block the zeroth order diffracted beam so that the image of the target formed on sensor 123 is formed only from the −1 or +1 first order beam. The images captured by sensors 119 and 123 are output to image processor and controller PU, the function of which will depend on the particular type of measurements being performed. Note that the term 'image' is used here in a broad sense. An image of the grating lines as such will not be formed, if only one of the −1 and +1 orders is present.

The illumination system of the inspection and/or metrology apparatus comprises an illuminator 110. As shown in FIG. 1*c*, this illuminator 110 comprises lens 112 and aperture plate 113. More details of the inspection and/or metrology apparatus can be found in U.S. Pat. No. 9,946,167 B2.

Figure 1D:
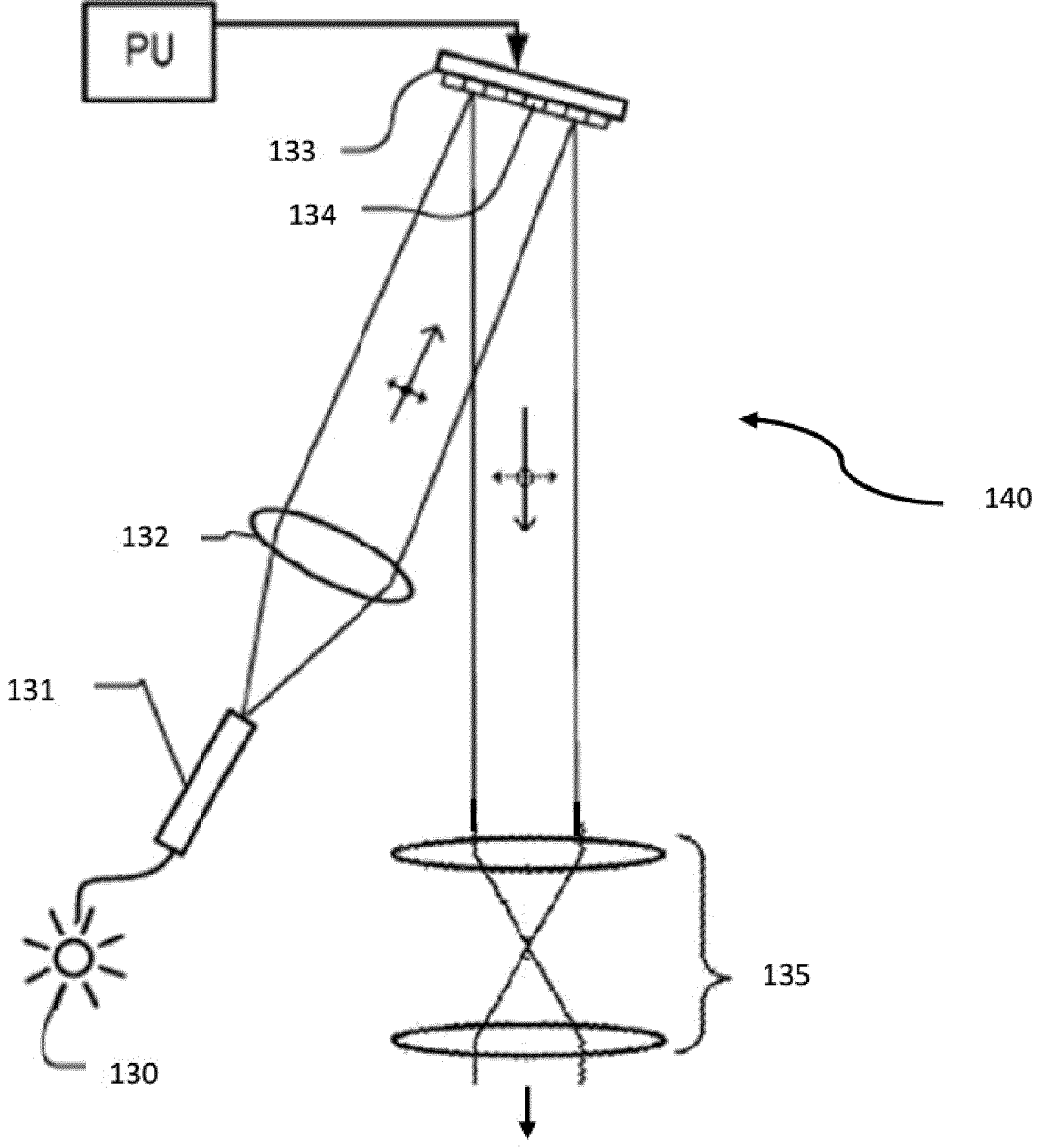
FIG. 1d depicts a programmable illuminator for use in the inspection and/or metrology apparatus of FIG. 1c.

FIG. 1*d* shows a programmable illuminator 140 for use in the inspection and/or metrology apparatus of FIG. 1*c*. This programmable illuminator 140 can be used in the inspection and/or metrology apparatus of FIG. 1*c* instead of the illuminator 110. The programmable illuminator 140 comprises a micromirror array 133 according to the present invention as well as a low NA relay 4F system 135 comprising a pair of lenses. Radiation or light from a radiation source 130 (not part of the programmable illuminator 140), e.g. a broad band radiation source or white light source, may be directed via an optional fiber 131 and an optional collimating lens system 132 to the micromirror array 133. A processing unit PU can control the micromirror array 133 in such a way that the micromirrors 134, or more precise the mirrors in the micromirrors 134, in the micromirror array 133 are tilted individually. By tuning the tilt angle of each individual mirror independently, the spatial distribution of the light that is output by the low NA relay system 135 can be controlled and various illumination modes can be made as desired without having to use aperture plates. If the programmable illuminator 140 is used in the inspection and/or metrology apparatus of FIG. 1*c* it interfaces with lenses 114, meaning that the light that is output by the low NA relay system 135 is received by the lenses 114 of FIG. 1*c*.

In order to control the spectral distribution of the light that is output by the low NA relay system 135 at least part of the mirrors in the micromirror array 133 may comprise a grating on top of the mirror surfaces (not shown). The grating may be the same for all mirrors or, alternatively, different gratings, e.g. gratings having different pitches, may be used. By appropriate control of the micromirror array 133 the light that is output by the low NA relay system 135 comprises a single wavelength or a single (narrow) range of wavelengths. It is however also possible to control the micromirror array 133 in such a way that the light that is output by the low NA relay system 135 comprises a number of different wavelengths or a number of different (narrow) ranges of wavelengths. The gratings may be lithographically patterned on the mirror surfaces. Each mirror with grating diffracts light of different wavelengths in different directions according to the associated grating equation. A portion of the diffracted light is captured by the low NA relay system 135 and an image is formed. By tuning the angle of each mirror independently, the light distribution at the output can be controlled both spatially and spectrally as (a) certain diffraction order(s) will be captured by the low NA relay system 135 and (an)other diffraction order(s) will not be captured. Such a spatial and spectral light distribution can be used advantageously for example for illuminating and measuring an overlay target structure on a substrate or for measuring the position of an alignment mark on a substrate. In this text, the terms target structure, target, mark, marker and grating are, where the context allows, all synonyms of each other.

The spectral bandwidth of the diffracting beam which can be captured by the low NA relay system 135 is d$\lambda$=P·NA where P is the pitch of the grating and NA is the numerical aperture of the low NA relay system 135. With P=500 nm and NA=0.02 the spectral bandwidth is 10 nm, meaning that a diffraction order of the grating comprises a range or band of wavelengths of 10 nm.

The spatial resolution of the low NA relay system 135 is ~$\lambda$/NA. With $\lambda$=850 nm and NA=0.02 the spatial resolution is 42.5 micrometer. If the size of the mirrors Is greater than 42.5 micrometer, each mirror can be resolved. A reasonable size of a mirror is 100×100 micrometer.

By rotating/tilting the mirrors around their individual axis, a different central wavelength band can be directed into the low NA relay system 135. The rotating range of each mirror required for operation over the visible wavelength range should be $\Delta\lambda$/2P, where $\Delta\lambda$=400 nm for an operating wavelength range of 450 nm-850 nm. This means that each mirror must be able to rotate by 0.4 radians.

Figure 2:
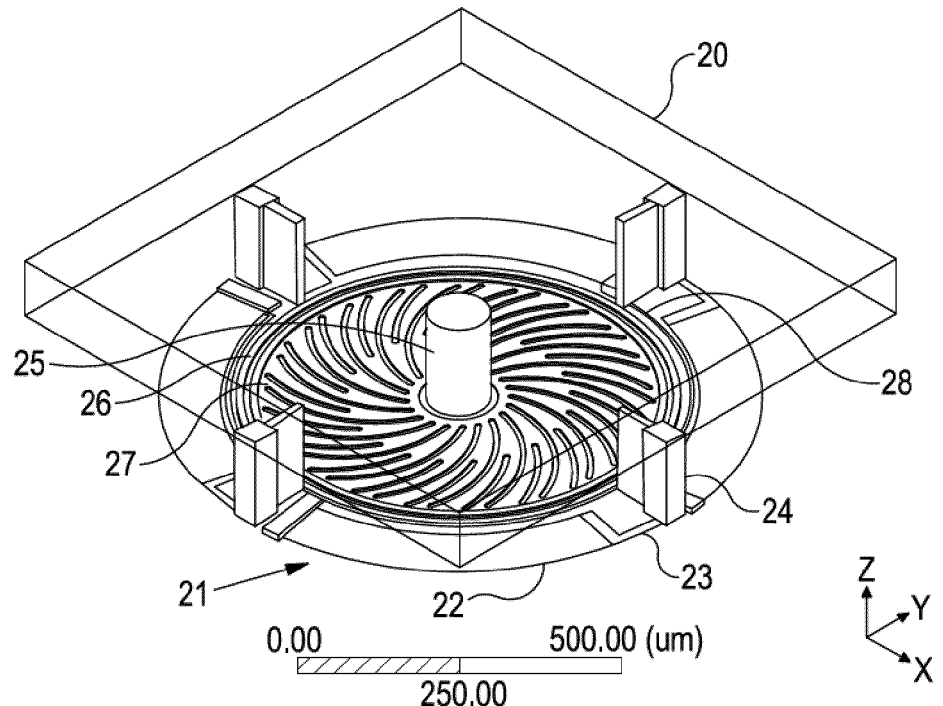
FIG. 2 depicts a part of a micromirror array according to an embodiment comprising a mirror and four piezoelectric actuators.

The MEMS system shown in FIG. 2 is a micromirror with a mirror 20 and four piezoelectric actuators 21 for displacing the mirror 20. In other embodiments (not shown) the micromirror may have a different number of piezoelectric actuators 21 for displacing the mirror 20. In all these embodiments the micromirror has at least one piezoelectric actuator 21 for displacing the mirror 20. A number of micromirrors as shown in FIG. 2 can be arranged in an array to form a micromirror array.

FIG. 2 shows a MEMS system with a MEMS element being a mirror 20 which may be a part of a micromirror array according to an embodiment. The MEMS system has a four-fold rotational symmetry about an axis. In particular, four piezoelectric actuators 21 are arranged symmetrically under the mirror 20 to enable tip and tilt displacement of the mirror 20. The mirror 20 is typically rectangular (which in this document is used to include square) with each side being in the range 0.5 mm to 2.5 mm. For example, it may be square with a 1 mm$^2$ surface area. In other embodiments the mirror may be another shape, such as hexagonal. Each piezoelectric actuator 21 has a curved strip of flexible material 22, fixed to the underlying substrate (no shown) at one end and connected via a hinge 23 to a pillar 24. The strip of flexible material 22 has an elongation direction which at rest lies substantially parallel to the plane of the front surface of the mirror 20. The strip of flexible material 22 has a layer of piezoelectric material (e.g. PZT) on it, to which a voltage can be applied in order to activate the piezoelectric actuator 21. When activating the piezoelectric actuator 21, the strip 22 bends, acting as a cantilever, to displace the mirror 20 via the pillar 24. The magnitude of the displacement is a function of the applied voltage (as well as being a function of other parameters, such as the geometry of the piezoelectric actuator). The hinge 23 is formed by narrowing the strip 22 at one end, so that the cross sectional area of the hinge 23 is smaller than that of the strip 22 along the elongation direction of the strip 22. The hinge 23 is therefore less stiff than the strip 22, which allows it to act as a hinge. The hinge is typically required to flex in a plane transverse to an axis direction, which itself is transverse to the elongation direction of the strip 22.

The mirror 20 is also connected to a heat diffuser, comprising a thermally conductive post 25 connected to the center of the back of the mirror 20, and a heat sink 26 connected to the other end of the post 25. In a rest condition, the length direction of the post 25 is the axis of four-fold rotational symmetry of the MEMS system. The thermally conductive post 25 is arranged to transfer heat from the mirror 20 to the heat sink 26, which diffuses the heat over a relatively large surface area. The heat sink 26 comprises a flexible membrane being a circular, patterned silicon layer. It may alternatively have multiple layers; if so, one or more (e.g. all) of the layers may be silicon, and one or more layers may be of material of other than silicon. The flexible membrane has curved grooves 27 formed in it, which increase the flexibility of the flexible membrane. In use, when the mirror 20 is displaced, the thermally conductive post 25 pivots and elastically deforms the flexible membrane.

Each piezoelectric actuator 21 is associated with a sensing element 28, being a piezoresistor fixed to the pillar 24 at one end and to the underlying substrate at the other. As the pillar 24 is displaced, the piezoresistor is stressed/deformed, which changes the electric properties of the piezoresistor, from which the displacement can be determined. For example, the piezoresistor may be connected in a Wheatstone bridge, configured so that the output voltage of the bridge is a function of the displacement of the mirror 20. The output from the piezoresistor is temperature sensitive, and temperature compensation may be used to increase the accuracy of displacement measurements.

The microelectromechanical system (MEMS) used to displace the mirrors 20 can be advantageously incorporated in other parts of the lithographic apparatus and/or the inspection and/or metrology apparatus. Looking at FIG. 2, the mirror 20 of each MEMS element can be replaced by a displacement structure being any form of non-reflective object that fits over the MEMS element, and which translates the displacement from the piezoelectric actuators 21. Such a displacement structure can have the same shape and dimensions as the mirror (e.g. square as in FIG. 2), but does not require a reflective top surface. Instead of directly reflecting incident light, the displacement structure can be used to deform an overlying structure, such as a continuous reflective layer of a mirror. In this way, the MEMS can be incorporated in the patterning device to deform the multilayer reflector and thereby redirect incident light. Alternatively, instead of replacing the mirror 20 with a displacement structure, the pillars 24 connected to the piezoelectric actuators 21 may be directly bonded to the overlying structure. That is, the pillars 24 may be directly bonded to the underside of the overlying structure (e.g. the underside of a multilayer reflector), in order to deform that structure with the piezoelectric actuators 21.

Figure 3:
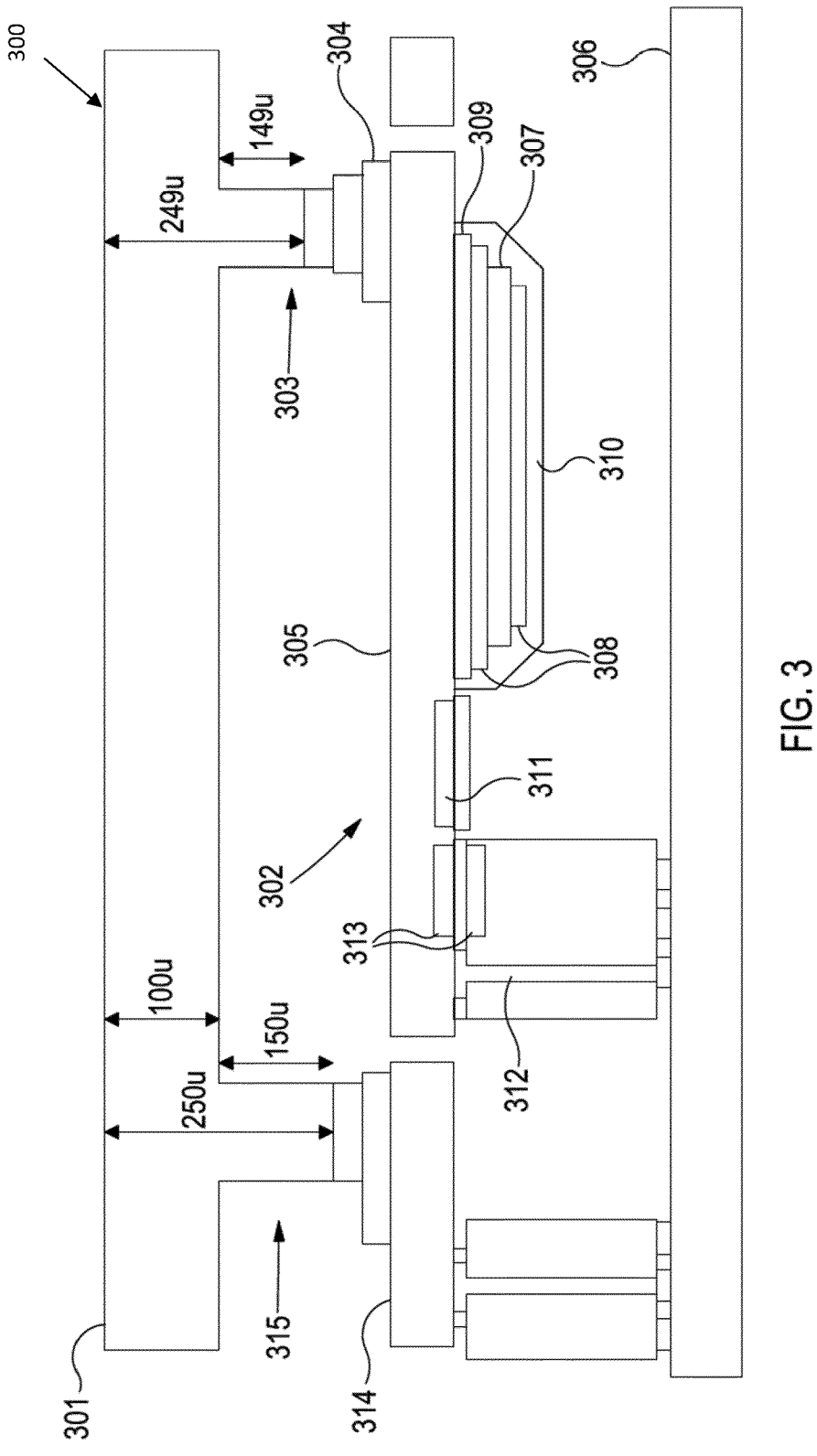
FIG. 3 depicts a schematic cross section of a part of a micromirror array according to an embodiment.

FIG. 3 shows a schematic diagram of a cross section of a part of a micromirror array 300 according to an embodiment. A mirror 301 is connected to a piezoelectric actuator 302 via a pillar 303. The pillar 303 comprises layers of silicon, germanium, aluminum and oxide having a combined thickness of 151 μm. The oxide layer 304 has a thickness of 1 μm and provides both thermal and electrical insulation to protect the piezoelectric actuator 302.

The piezoelectric actuator 302 comprises a strip of flexible material 305, being a 5 μm thick strip of silicon, connected to a substrate 306 at the opposite end from pillar 303. The piezoelectric actuator 302 also comprises a layer of piezoelectric material 307 being a layer of PZT having a thickness in the range of 500 nm to 2 μm. The layer of piezoelectric material 307 has top and bottom electrodes 308 made of platinum (Pt) and LaNiO3 (LNO) for applying a voltage to the layer of piezoelectric material 307. The layer of piezoelectric material is bonded to the strip of flexible material 305 by a layer of nitride (SiN) 309 having a thickness of 100 nm. The stack of SiN/Pt/LNO/PZT/Pt/LNO is covered by a layer of silicon oxide and aluminum oxide 310. Applying a voltage to the electrodes 308 causes the layer of piezoelectric material 307 to contract or expand, but because the layer is constrained at the interface to the strip of flexible material 305, the combined system of the layer of piezoelectric material 307 and the strip of flexible material 305 bends. It is this bending motion of the piezoelectric actuator 302 which displaces the pillar 303 and thereby also the mirror 301.

A sensing element 311 comprising a piezoresistor is embedded in the strip of flexible material 305 and covered by oxide. The sensing element 311 is arranged to sense the deflection of the piezoelectric actuator 302.

The piezoelectric actuator 302 is electrically connected to the substrate 306 by a through silicon via (TSV) 312. Application specific integrated circuits (ASICs) 313 can be used to apply the voltage to the piezoelectric actuator 302 and also to derive the output voltage from the sensing element 310.

The mirror 301 is connected to a heat sink 314 by a thermally conductive post 315. The heat sink 314 and the thermally conductive post 315 together form a heat diffuser for dissipating heat from the mirror 301. The post 315 comprises layers of silicon, germanium and aluminum. The heat sink 314 comprises a flexible element, specifically in this example a flexible membrane of silicon, which allows the post 315 to move as the mirror 301 is displaced. The heat sink 314 is electrically connected to the substrate 306, and may be grounded to prevent charge build up on the mirror 301. The heat sink 314 and the strip of flexible material 305 are in the same plane and may be formed from the same silicon wafer. The spacing between the lower surface of the mirror 301 and the upper surface of the heat sink 314 and/or the strip of flexible material 305 may be in the range 50 μm-120 μm, such as about 80 μm. Typically, known micromirror arrays have a smaller spacing than this, such as only a few microns. The greater spacing is achieved in this embodiment because the (piezoelectric) actuation force is generated on the strip of flexible material 305, rather than, for example, by an electrostatic actuator mounted on the mirror itself, which would typically limit the range of movement of the mirror to the range of relative movement of components of the electrostatic actuator.

The spacing between the lower surface of the heat sink 314 and/or the strip of flexible material 305, and the upper surface of the substrate may be in the range 50 μm-120 μm, such as about 80 μm.

Each mirror may be provided with one or more control units which are operative to recognize, in a received control signal, an address corresponding to the mirror, and, upon recognizing the address, to generate control voltages for one or more piezoelectric actuators of the mirror based on control information additionally contained in the control signal. The control units may be implemented as the ASICs 313 which receive the control signals using the vias 312 and control the corresponding piezoelectric actuator 302 based on it; in this case, the address in the control signal may specify not only the mirror but also the ASIC 313 for a given piezoelectric actuator 302. Using the control units, an external control system is able to individually control all the mirrors of the mirror array, by transmitting identical control signals to the control units of all of the mirrors, such that each control unit recognizes control signals addressed to it, and controls the corresponding piezoelectric actuator(s) accordingly. Positioning the ASICs 313 within the structure, e.g. supported above the substrate 306 and proximate to (e.g. substantially in plane with) the strip of flexible material 305, is achievable because the embodiment may be formed in multiple layers by a MEMS process, as described below.

Figure 4:
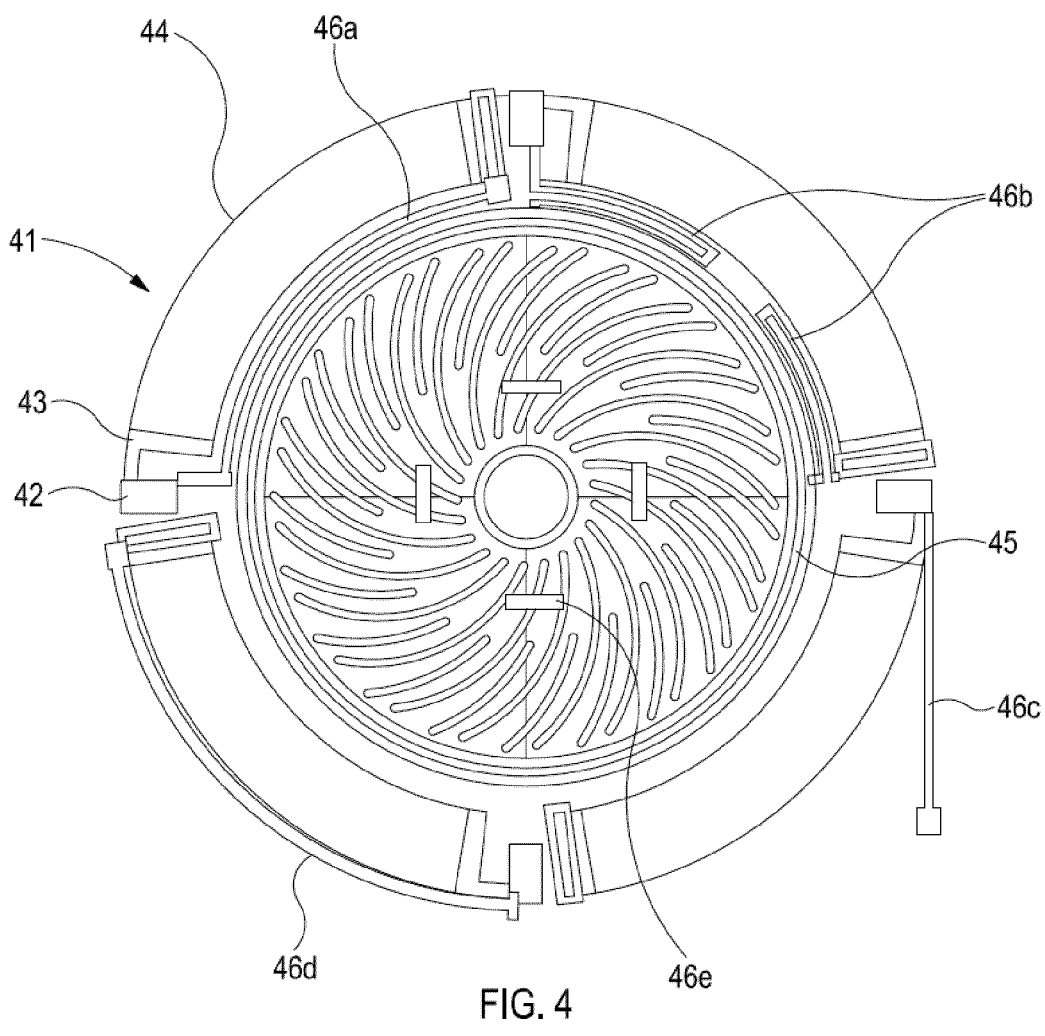
FIG. 4 depicts a part of a micromirror array according to another embodiment having multiple different sensing elements for sensing mirror displacement.

FIG. 4 shows a schematic diagram of a top view of a MEMS system 40 for controlling a mirror (not shown) in a micromirror array according to an embodiment. The system 40 comprises four piezoelectric actuators 41 connected to the mirror by respective pillars 42. Each piezoelectric actuator 41 comprises a strip of flexible material 43 and a hinge 44, wherein the pillar 42 is connected to the hinge 44 at one end of the strip 43 and wherein the other end of the strip 43 is connected to (that is, in a substantially fixed positional relationship to) the substrate (not shown). The system 40 also comprises a heat diffuser 45 for diffusing heat from the mirror when in use. The heat diffuser 45 comprises a circular silicon layer fixed to the substrate along an outer edge of the silicon layer and a thermally conductive post connected to the center of the silicon layer.

The system 40 comprises any one or more of five different types of sensing elements 46a to 46e illustrated in FIG. 4 for sensing a displacement of the mirror. Each sensing element 46a to 46e comprises a piezoresistor arranged so that displacement of the mirror induces stress in the piezoresistor. Preferably, each of the actuators is provided with only one of these five types of sensing element 46a to 46e, and the same type of sensing element is used in each of the four actuators.

A first type of sensing element 46a comprises a curved beam located in the annular space between the heat diffuser 45 and the piezoelectric actuator 41 and fixed to the substrate at one end and to the pillar 42 at the opposite end. One or more piezoresistors may be formed in the beam.

A second type of sensing element 46b comprises two folded beams comprising respective piezoresistors, each located in the annular space between the heat diffuser 45 and the piezoelectric actuator 41. One of the folded beams is connected to the substrate and to the pillar 42, whereas the other folded beam is connected to two different points of the substrate to provide a reference value.

A third type of sensing element 46c comprises a straight beam comprising a piezoresistor connected to the pillar 42 at one end and to the substrate at the other end.

A fourth type of sensing element 46d comprises a curved beam comprising a piezoresistor, the beam being located outside the piezoelectric actuator 41. The beam is connected to the substrate at one end and to the pillar 42 at the opposite end.

A fifth type of sensing element 46e comprises four piezoresistors fixed to the heat diffuser 45. The fifth sensing element 46e is for sensing deformation of the heat diffuser caused by displacement of the mirror.

Figure 5:
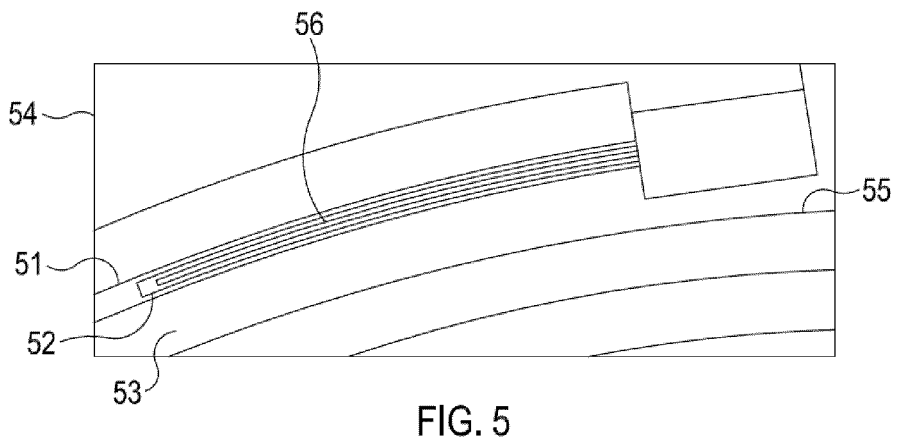
FIG. 5 depicts a part of a piezoresistor sensing element for use in one of the embodiments of FIGS. 2 to 5.

FIG. 5 shows a schematic diagram of a top view of a part of a sensing element 50, which may be the first sensing element 46a in FIG. 4 but the other sensing elements have a similar construction. The sensing element 50 comprises a curved beam 51 (also referred to here as a sensing beam) and a folded piezoresistor 52 (piezoresistor sensing element) in the annular space 53 between the piezoelectric actuator 54 and the heat diffuser 55. One end of the beam may be anchored to the substrate, and the beam may be deformed by motion of the mirror, thus changing the resistance of the piezoresistor 52. A temperature sensor 56 may be provided to measure the temperature of the piezoresistor 52. The temperature sensor 56 may for example be implemented as a bipolar transistor or a diode, since for such devices the current is a function of temperature. The sensors 52, 56 are preferably placed as close as possible to the anchor point of the beam 51 to limit the temperature swing during measurement. The sensing beam 51 acts as a thermal resistor between the high temperature of the mirror and the low temperature anchor.

Figure 6:
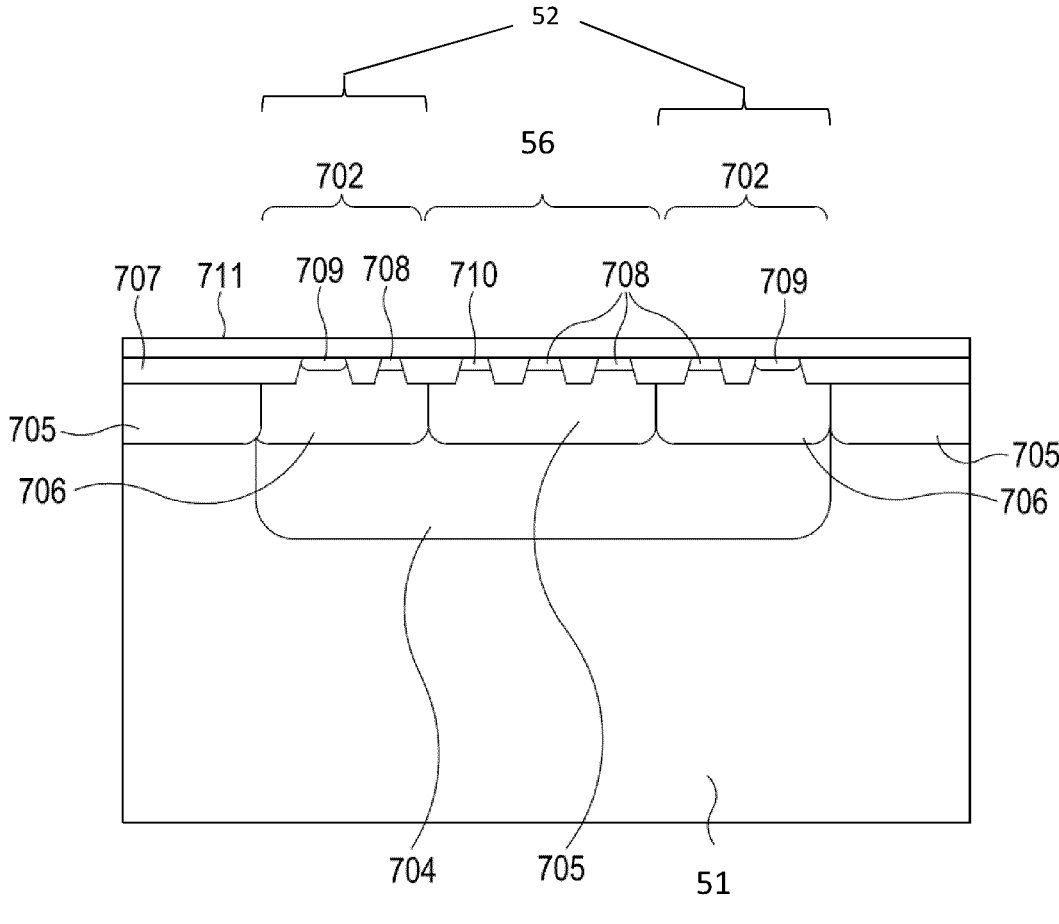
FIG. 6 depicts the construction of the piezoresistor sensing element and a temperature sensor in the arrangement of FIG. 5.

FIG. 6 shows an example of the construction of a piezoresistor sensing element 52 and temperature sensor 56 in the curved beam 51. In FIG. 6, the curved beam 51 is shown in cross-section looking along its length direction, and all regions shown extend in the length direction, i.e. in the direction into the page.

The folded piezoresistor 52 is implemented as two "legs" 702 which lie to either side of the temperature sensor 56.

The curved beam 51 may be formed of p-type silicon or other semiconductor. It includes a buried deep well of n-type semiconductor 704. In a region above the n-well well 704, are wells of p-type semiconductor 705 and wells of n-type semiconductor 706. All the wells 704, 705, 706 may be formed by ion implantation into the curved beam 51. The layer above the wells 704, 705, 706 is labelled 707. It is an insulating layer, such as of $SiO_2$. Implants 709 of piezoelectric material, and n-plus doped regions 708, are formed in wells in regions left open by gaps in the insulating layer 707, which isolates the different implant regions electrically from each other. Thus, each of the legs 702 is constituted by one of the piezoelectric implants 709 and, spaced from it in the direction towards the other of the legs 702, one of the n-plus doped regions 708. The legs 702 and temperature sensor 56 are covered by a further insulating layer 711 as a cover layer.

The temperature sensor 56, which is between the legs 702, is implemented by p-plus doped semiconductor region 710 and two n-plus doped regions 708. These regions collectively form a bipolar transistor. The bipolar transistor is connected as a diode by electrically connecting the base and collector together at a position outside the plane of FIG. 6. Due to the close proximity of the sensors 52, 56, the temperature difference between them is very small.

Figure 7A:
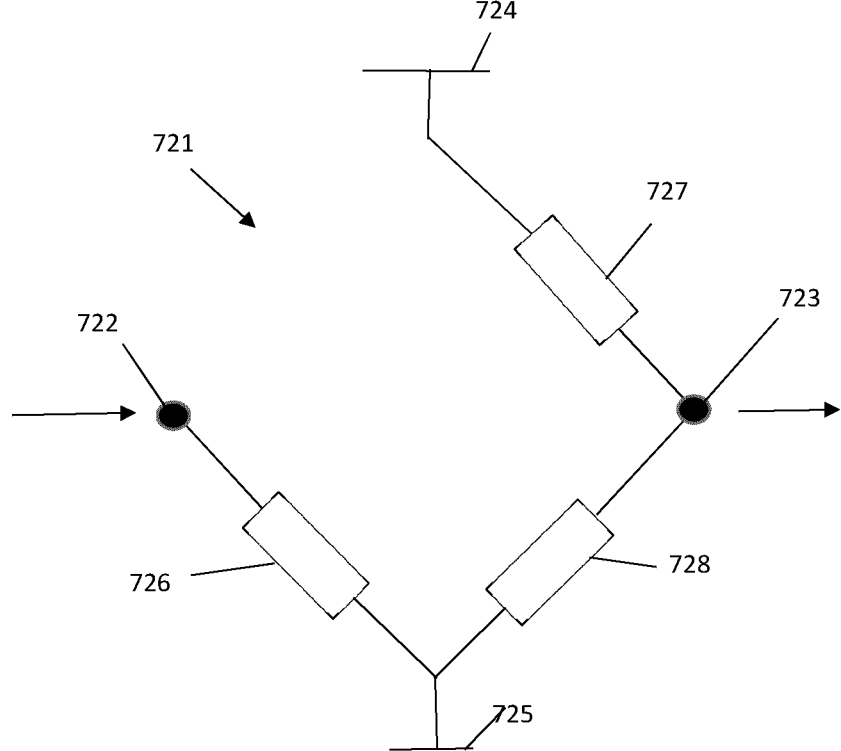
FIG. 7a depicts a configuration of resistors in an electrical bridge element used to modify a sensor signal generated by the piezoresistor sensing element in the arrangement of FIG. 5.

FIG. 7a shows a circuit diagram of an electronic bridge element 721 (Wheatstone bridge). The bridge element 721 includes an input terminal 722, and output terminal 723, and two voltage supply terminals 724, 725. The two voltage supply terminals 724 and 725 are connected to different respective steady voltages. For example the voltage supply terminal 724 may be connected to a positive supply voltage $V_s$ and the voltage supply terminal 725 may be connected to ground.

The piezoresistor 52 is connected between the voltage supply terminal 724 and the input terminal 722. A change in the resistance of the piezoresistor 52, results in a change of the voltage between terminals 722 and 723. Thus, the input terminal 722 receives from the left of FIG. 7a the sensor signal generated by the folded piezoresistor 52. The output terminal 723 generates a modified analogue sensor signal which is transmitted to the right of FIG. 7a. The modified sensor signal may be the voltage (signal) difference between input and output terminals 722, 723 of the bridge.

Figure 7B:
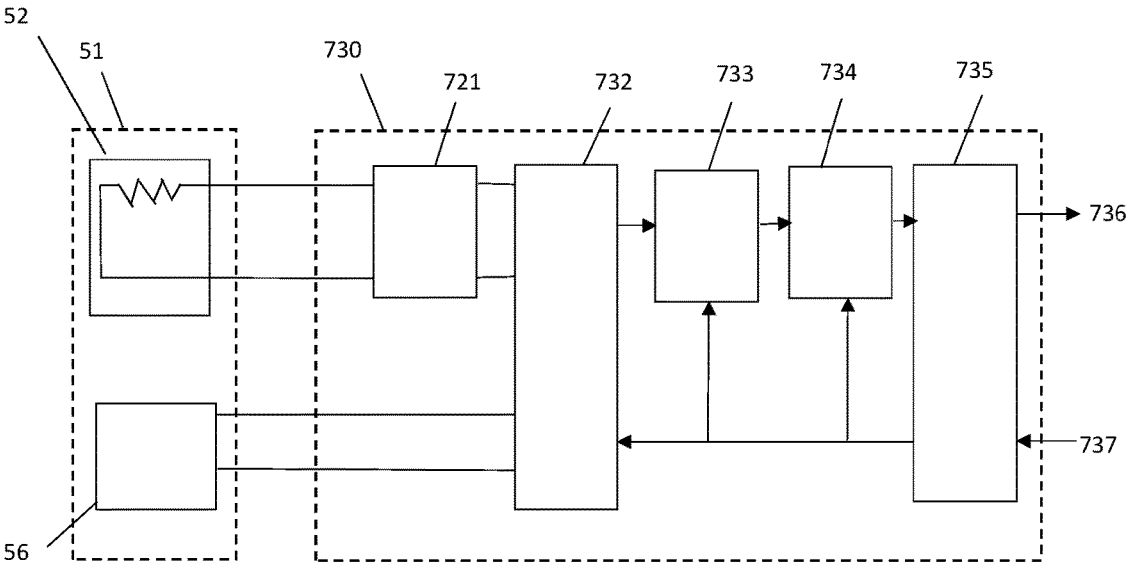
FIG. 7b depicts schematically a sensing beam in one of the embodiments of FIGS. 2 to 5, and a control unit receiving, modifying and transmitting electronic signals generated in the sensing beam.

FIG. 7b shows schematically the analogue temperature signals passing from the sensing beam 51 to a control unit 730. This control unit 730 may correspond to one of the ASICs 313 shown in FIG. 3. The control unit 730 receives the analogue temperature signal generated by the temperature sensor 56, and the analogue sensor signal generated by the piezoresistor sensing element 52. The sensor signal generated by the piezoresistor sensing element 52 is modified by the electronic bridge element 721. The outputs of the electronic bridge element 721 and the temperature sensor 56 are transmitted to a multiplex unit 732 of the control unit 730.

The control unit 730 also includes an electronic interface 735 which is in two-way communication with a controller (shown as 740 in FIG. 7c, described below). The controller may be mounted on the substrate, for example in the position on the underside of the substrate 306 in the arrangement shown in FIG. 3. The control unit 730 and controller may in this case communicate using vias passing through the substrate 306, which are electrically connected to the vias 312. The signals transmitted by the control unit 730 to the controller are labelled 736 in FIG. 7b, and the signals received from the controller are labelled 737.

The components of the control unit 730 shown in FIG. 7b are those which generate the signal 736, but there may be other components of the control unit 730 which receive command signals (included in signal 737) which instruct the control unit 730 to transmit the actuator control voltages to the piezoelectric actuator(s) of the mirror. Alternatively, these other components may be part of a different control unit (e.g. in the case of FIG. 3 another of the ASICS 313). This second possibility is assumed in FIG. 7d, described below.

The signals 737 which the control unit 730 receives from the controller using the interface 735 may include a clock signal which the interface 735 transmits to the multiplex unit 732. Based on this clock signal, the multiplex unit 732 transmits to an amplifier unit 733 selectively at different times both: the modified sensor signal generated by the electronic bridge element 721; and the temperature signal output by the temperature sensor 56.

The amplifier unit 733 amplifies the signal it receives and transmits it to an analogue-to-digital converter (ADC) 734. The number of bits in the digitized signals produced by the ADC depends upon the required accuracy in the control of the mirrors, and is typically at least 9 bits. In one example, the ADC may provide a resolution of 14 bits. Both the amplifier unit 733 and the ADC 734 may also receive the clock signal.

At times when the ADC 734 receives from the amplifier unit 733 the analogue modified sensor signal generated by the electronic bridge element 721, the ADC 734 generates a digital sensor signal. At times when the ADC 734 receives from the amplifier unit 733 the analogue temperature signal generated by the temperature sensor 56, the ADC 734 generates a digital temperature signal.

In either case, the output of the ADC 734 is transmitted by the interface 735 to the controller as the signal 736.

Optionally, the electric bridge unit 721 of the control unit 730 may further include a bridge temperature sensor which generates at least one analogue bridge temperature signal. The bridge temperature signal indicates the temperature of the resistors 726, 727, 728 of the electronic bridge unit 721. The bridge temperature signal is transmitted to the multiplex unit 732. With a timing depending upon the clock signal, the multiplex unit 732 transmits the bridge temperature signal to the amplifier unit 733, which in turn transmits it to the ADC 734. The ADC 734 uses the amplified bridge temperature signal to generate a digital bridge temperature signal. This too is transmitted to the interface 735, and transmitted to the controller as part of the signal 736.

Figure 7C:
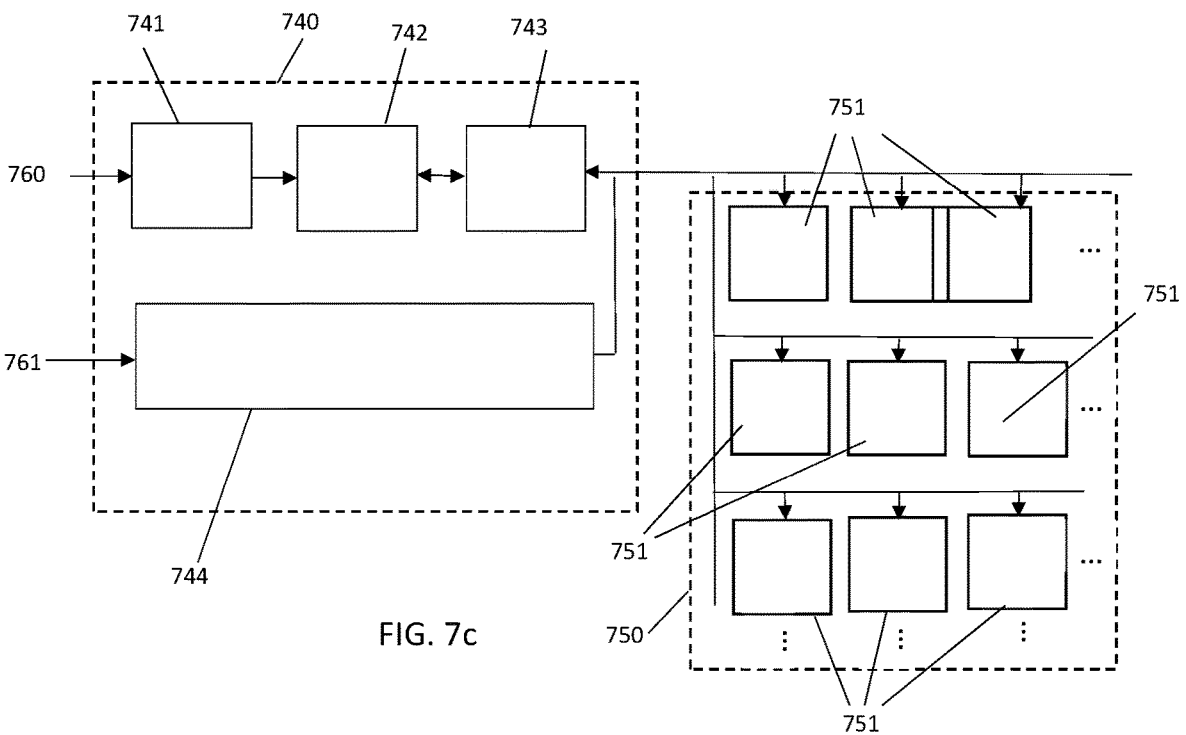
FIG. 7c depicts a control system in one of the embodiments of FIGS. 2 to 5.
Figure 7D:
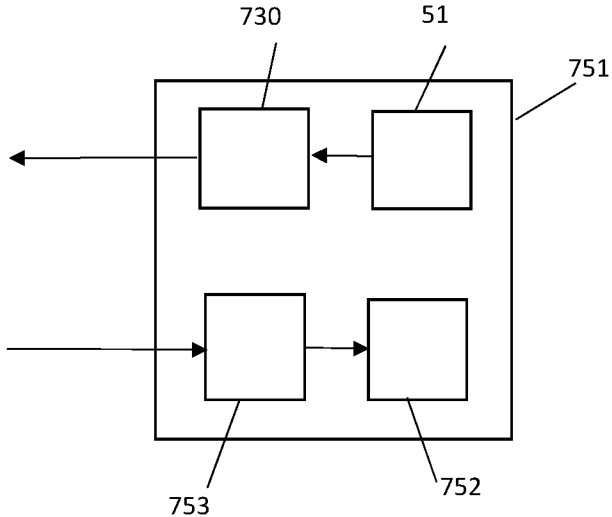
FIG. 7d depicts a portion of the control system of FIG. 7c which is associated with a mirror element.

Turning to FIG. 7c, the overall control system is shown. The portion of the control system which is associated with each of the mirror elements is indicated as 751, and is shown in more detail in FIG. 7d. Each circuitry portion 751 includes the circuitry shown in FIGS. 5-6 and 7a provided on the sensing beam 51, and the control unit 730 depicted in FIG. 7b. It also includes a second control unit 753 (e.g. another ASIC 313) associated with the mirror, which receives control signals generated by the controller 740 which encode target actuator control voltages calculated by the controller 740 as discussed below. Based on these target actuator control voltages, the second control unit 753 generates actuator control signals having voltages equal to the target actuator control voltages, and transmits the actuator control signals to the piezoelectric actuator(s) 752 associated with the corresponding mirror, to cause the actuators to move the mirror.

Thus, the control system includes an array 750 of circuitry portions 751 associated with the respective mirrors, and each of the circuitry portions 751 is in two-way communication with the controller 740 as shown in FIG. 7c, using an interface 743 of the controller 740. The interface 743 allows the each circuitry portion 751 to transmit the digital sensor signal and corresponding digital temperature signals for each of the piezoresistor sensing elements, via an internal bus of the controller 740, to a mirror control unit 742. In the case that the electric bridge units 721 include a bridge temperature sensor which generates a bridge temperature signal, the digital bridge temperature signal generated by the ADC 734 of the control unit 730 is also passed to the mirror control unit 742.

The controller 740 includes a power management and reference generation unit 744 which receives an external power signal 761 from a power source outside the micromirror array. The power management and reference generation unit 744 powers the rest of the controller 740, and supplies power to the array 750 of circuitry portions 751. The controller 740 also includes an interface 741 for receiving a control signal 760 from outside the micromirror array, and transmitting it to the mirror control unit 742. Thus, the mirror control unit receives: the received control signal 760, the digital sensor signals and digital temperature signals. In the case that the electronic bridge unit 721 generates a bridge temperature signal, the mirror control unit 742 receives the digital bridge temperature signal also. Using all these signals, the mirror control unit calculates target actuator control voltages for all the actuators of all the mirrors as discussed below. These are transmitted by the interface 743 to the second control units 753 of all the circuitry portions 751, and used by the second control units 753 to generate the actuator control signals. The second control units 753 transmit the actuator control signals to the actuator(s) 752 of the corresponding mirrors.

The mirror control unit 742 calculates target actuator control signals which are intended to implement instructions for positioning the mirrors which are encoded in the control signal 760. The best target actuator control signals to achieve this depend upon the digital sensor signal, the digital temperature signal and the digital bridge temperature signal (if any). The relationship between the target actuator control signals and the signals the mirror control unit 742 calculates them from is a predetermined function. It may be obtained experimentally. Because the calculation of the target actuator control voltages is carried out on digital signals, the calculation of the actuator control signals is much more straightforward than attempting to do this using analogue signals would be. Furthermore, a more sophisticated calculation can be performed, in which for example the dependence of the target actuator control signals on the digital temperature signal includes not only a linear ($1^{st}$ order) dependence on the digital temperature signal but preferably also a $2^{nd}$ and/or $3^{rd}$ order dependence on the digital temperature signal. It has been found that the accuracy of determining the flexing of the mirror in the present arrangement is better than 40 parts per million (ppm).

The calculation may include modeling the strain in the temperature sensor. With this model, the temperature value indicated by the digital temperature signal is corrected to compensate for strain in the temperature sensor, which influences the output of the temperature sensor. The correction is performed using the digital sensor signal, and may include $1^{st}$, $2^{nd}$ and/or $3^{rd}$ order dependency on the digital sensor signal (and optionally on the digital bridge temperature signal (if any) also).

Similarly, the calculation may include modeling an estimated temperature value representing the temperature in the piezoresistor sensing element. In this model the strain value indicated by the digital sensor signal is corrected to compensate for the temperature in the piezoresistor sensing element, which influences the digital sensor signal. The correction is performed using the digital temperature signal, and may include 1st, 2nd and/or 3rd order dependency on the digital temperature signal (and optionally on the digital bridge temperature signal (if any) also).

Embodiments of the micromirror array can provide tip and tilt displacement range of +/−120 mrad and a mirror accuracy down to about 25 μrad. Embodiments of the micromirror array can be operated at high light intensities as required for EUV, and may work at 40 to 60 kW/m² of absorbed thermal power density (which implies an incident light power density on the surface of the mirror which is even larger). This is orders of magnitude higher than the absorbed thermal power density of micromirror arrays used in some other applications. This is possible because the piezoelectric actuators 41 are operative to provide, even at a relatively low actuator voltage (e.g. under about 100V), such a strong force that they are able to deform the flexible element (flexible member 314) even though the flexible element is thick enough to provide high heat conductivity to the substrate. Due to the high thermal conductivity, the micromirror array may in use have a temperature of under about 100 degrees Celsius.

Methods of forming a micromirror array are also described herein. FIGS. 8a to 8j illustrate some of the steps of an embodiment of such a method.

Figure 8A:
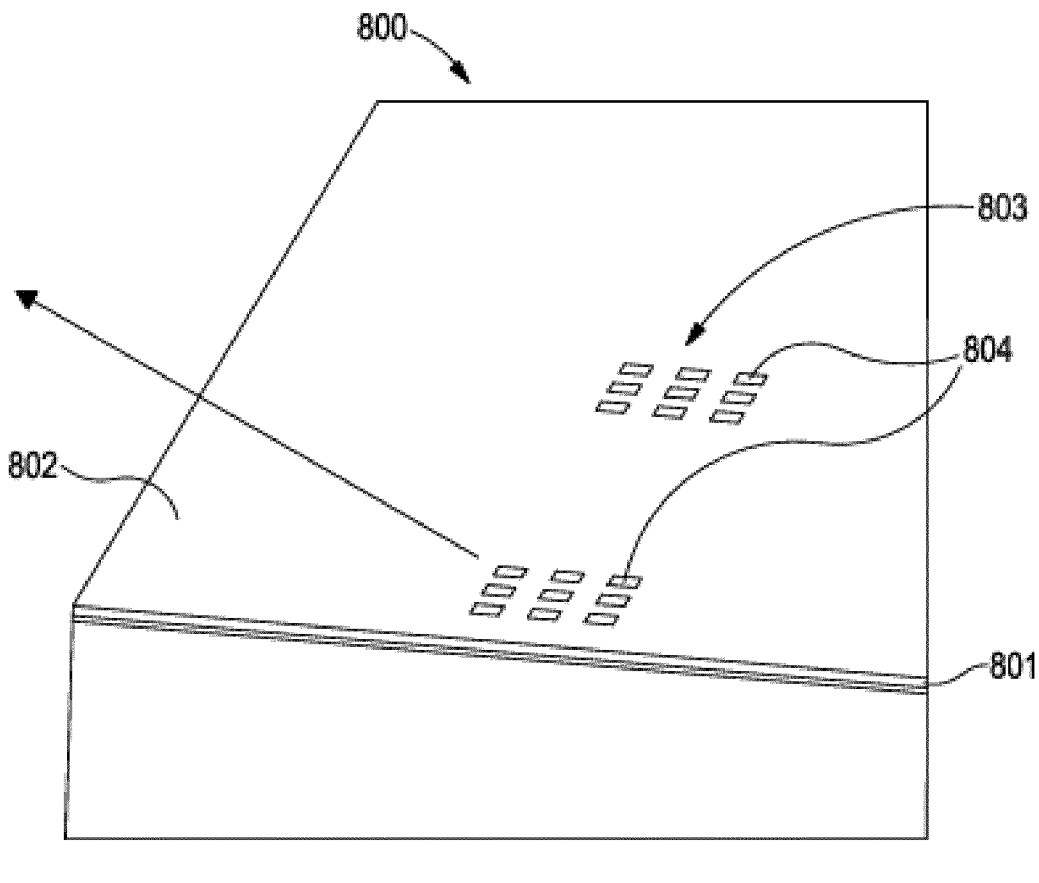
FIG. 8a depicts a first step in a method of forming a micromirror array.

As illustrated in FIG. 8a, the method comprises providing a first silicon wafer 800 for forming the piezoactuators and the sensing elements. The first wafer 800 may be referred to as the "actuator wafer". The actuator wafer may be a silicon on insulator (SOI) wafer with a 4 μm silicon film 801. Low voltage active devices such as the sensing elements can be formed in the wafer 800 using a Complementary Metal Oxide Semiconductor (CMOS) Front End of Line (FEOL) process. A CMOS Back End of Line (BEOL) process can then be used to form metal interconnect layers for connecting the low voltage devices to other circuitry. Chemical Mechanical Polishing/Planarization (CMP) can then be used to form a smooth surface with a planar oxide layer 802. A Cu damascene process can be used for forming a Cu bonding matrix 803 with CU pads 804 for subsequent Cu-Ox hybrid bonding to another wafer.

Figures 8B, 8C:
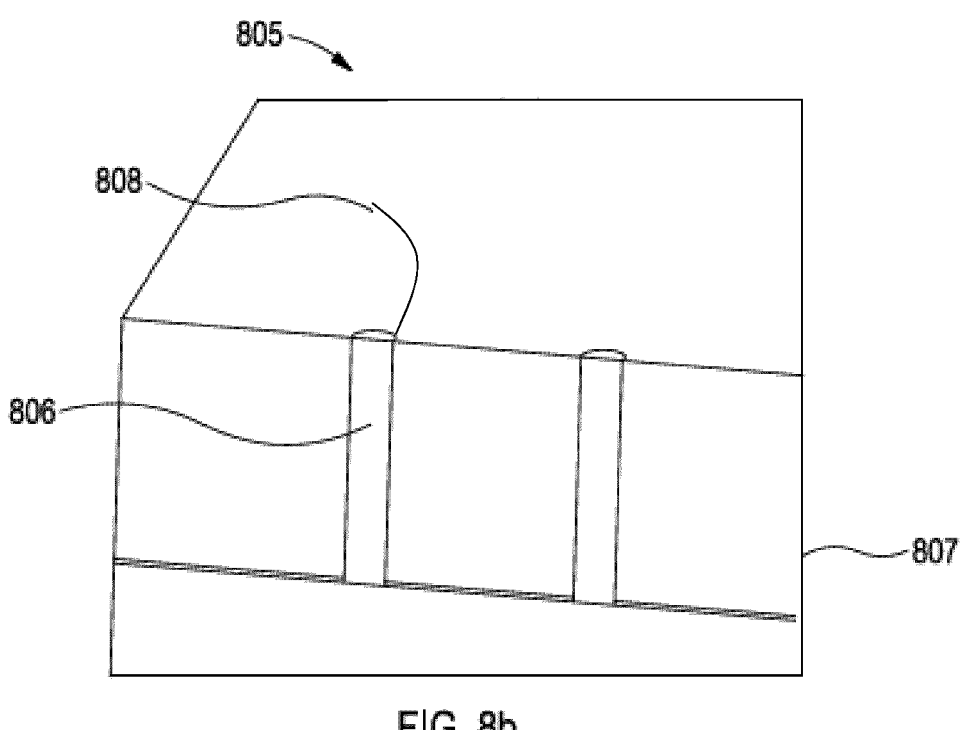
FIG. 8b depicts a second step in a method of forming a micromirror array.
FIG. 8c depicts a third step in a method of forming a micromirror array.

As illustrated in FIG. 8b, the method further comprises providing a second silicon wafer 805 which will become the substrate on which the micromirror array is fixed. The second wafer 805 may be referred to as the "interposer wafer". The interposer wafer 805 may be an SOI wafer with a 100 μm silicon film as seen in FIG. 8b. A high voltage (HV) CMOS process (both FEOL and BEOL) may be used to form a HV driver in the wafer. A TSV process can be used to form electrical connections 806 through the silicon film 807 of the second wafer 805. The TSV process can be followed by planarization (e.g. CMP or wet etch) and Cu pad formation. The Cu pads 808 are arranged to connect to the Cu bonding matrix 803 of the first wafer 800.

FIG. 8c illustrates how the first and second wafers 800 and 805 are bonded, e.g. using a Cu/oxide hybrid bond 809.

Figure 8D:
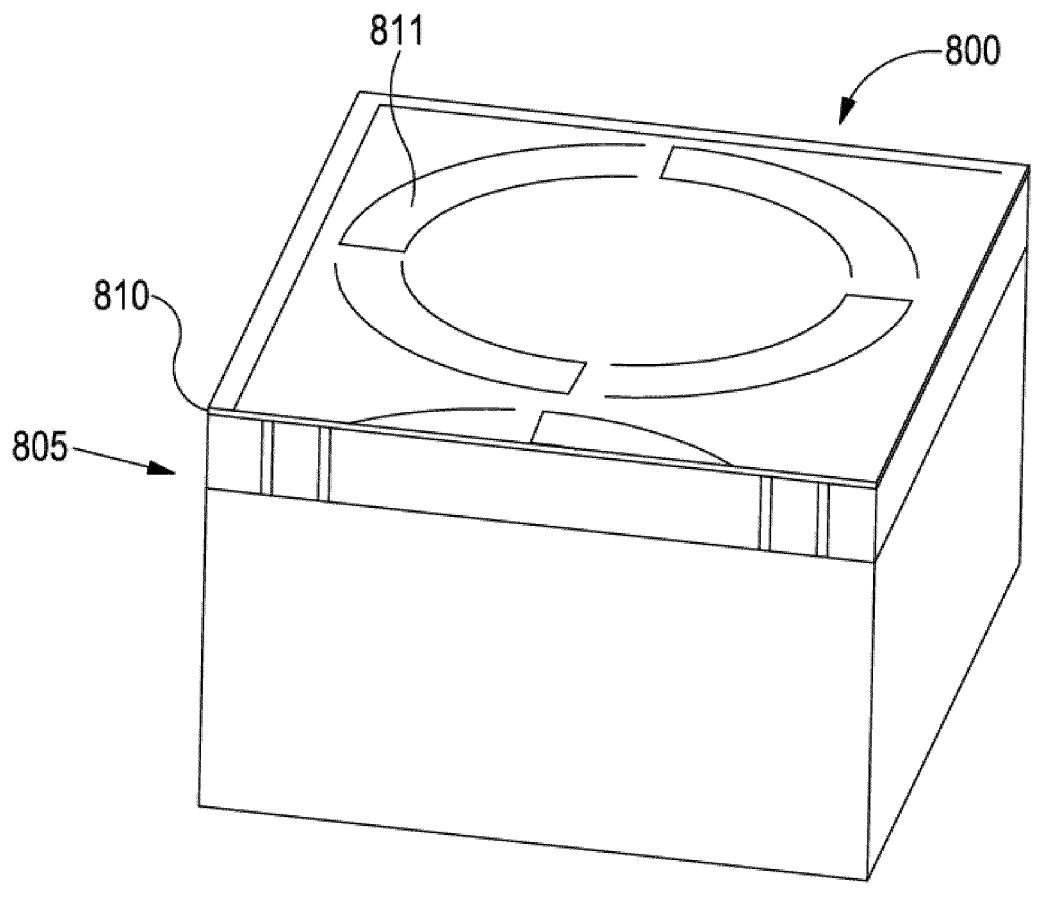
FIG. 8d depicts a fourth step in a method of forming a micromirror array.

As shown in FIG. 8d, a "handle wafer", used for handling the first wafer 800, may be removed to expose the first wafer 800. Selective box removal can then be used to leave a thin layer (e.g. 5 μm) of silicon 810 of the first wafer 800 bonded to the second wafer 805. Al can be deposited and patterned on the first wafer 800 for subsequent connection to a mirror. The first wafer 800 can be patterned to form the piezoelectric actuators 811. $Al_2O_3$ and/or TiN can be deposited on the first wafer for protection against EUV radiation and against plasma.

Figure 8E:
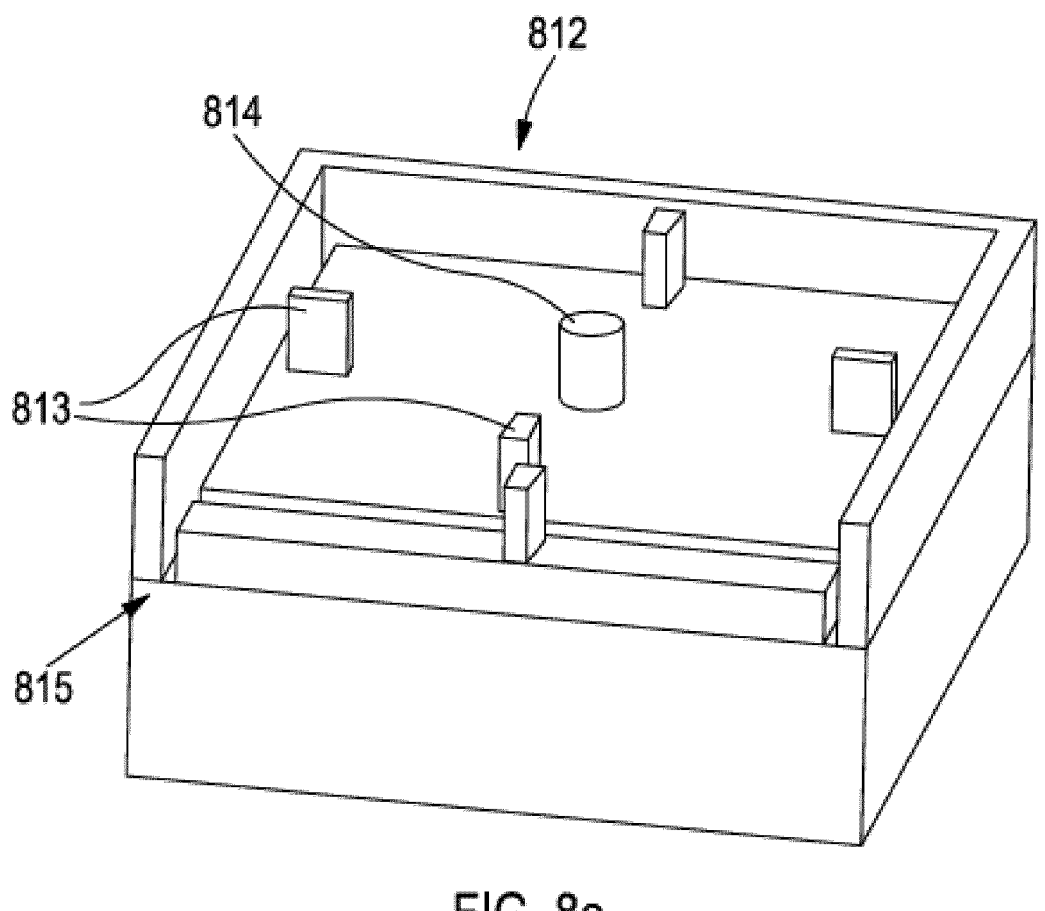
FIG. 8e depicts a fifth step in a method of forming a micromirror array.

As illustrated in FIG. 8e, the method further comprises providing a third silicon wafer 812 for forming the mirror. The third wafer 812 may be referred to as the "mirror wafer" 812. The mirror wafer 812 may be an SOI wafer with a 250 μm silicon film. The method may comprise performing a cavity etch on the mirror wafer 812 to allow for a thermal barrier (e.g. 1 μm to 2 μm), followed by Ge deposition for subsequent bonding to the first wafer 800. Using a hardmask (e.g. nitride) and a resist mask the mirror wafer 812 is etched to form pillars 813 ("beam connectors") for connecting to the piezoelectric actuators and to form a thermally conductive post 814 ("center post") for connecting to a heat sink so as to form a heat diffuser. A mirror release trench 815 is etched around the periphery of the mirror.

Figure 8F:
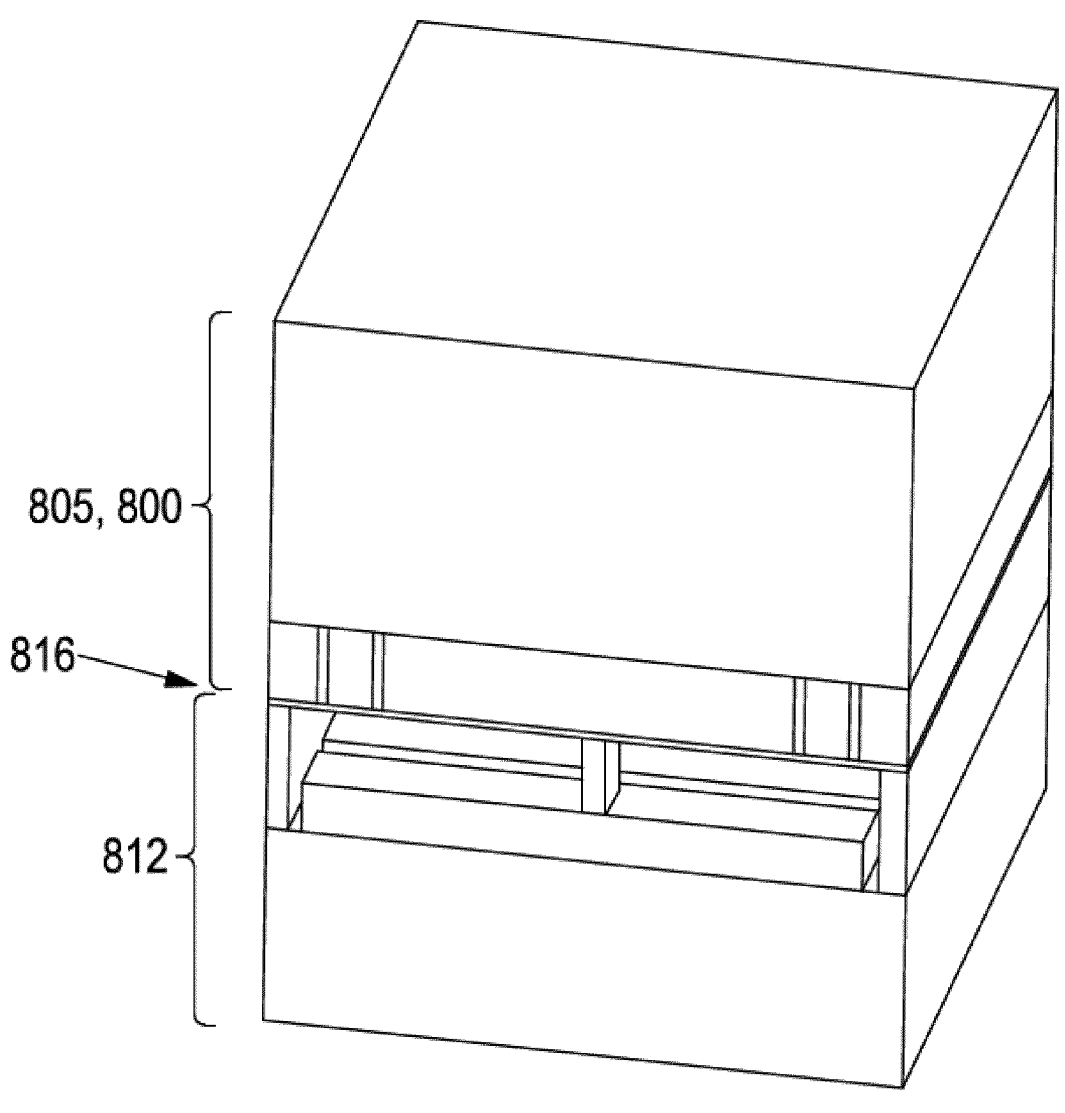
FIG. 8f depicts a sixth step in a method of forming a micromirror array.

As shown in FIG. 8f, the third wafer 812 is bonded to the first wafer 800 in order to connect the mirror to the piezoelectric actuators. The step of bonding may comprise aligned Ge/Al eutectic bonding. The Al/Ge bonding layer 816 is both thermally and electrically conducting, which can allow efficient heat transfer from the mirror through the thermally conductive post to the heat sink. Some of the box oxide may have been left on the first wafer 800 to reduce thermal and electrical conduction at some bonding locations such as at the pillars connected to the piezoelectric actuators.

Figure 8G:
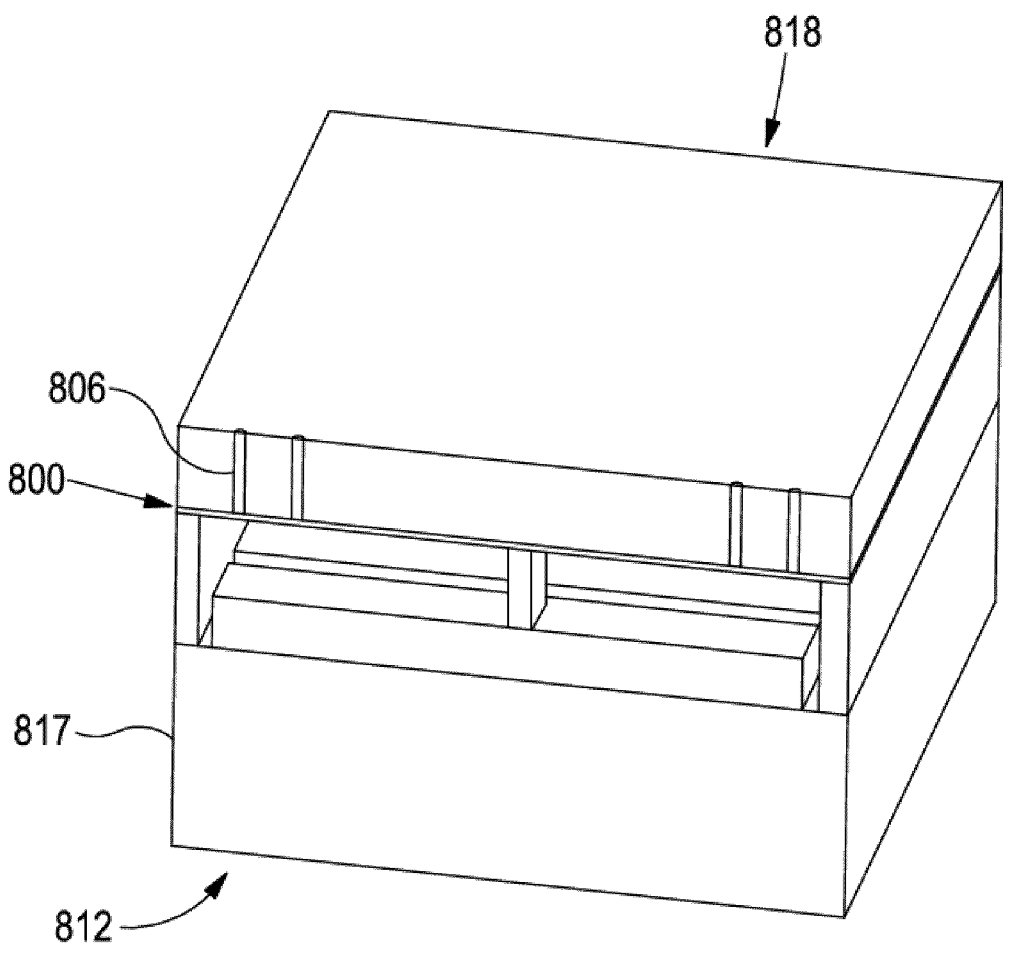
FIG. 8g depicts a seventh step in a method of forming a micromirror array.

In FIG. 8g, the stack of bonded wafers (wafers 1 "actuator wafer" 800, 2 "interposer wafer" 805 and 3 "mirror wafer" 812), which may collectively be referred to as the "device wafer", is turned upside down, so that the handle wafer 817 of the mirror wafer 812 becomes the supporting wafer. The handle wafer of the second wafer 805 can be removed from the second wafer 805 and box removal may be used to reveal the TSVs 806 in the second wafer 805. This can be followed by dielectric deposition, patterning and bump formation.

Figure 8H:
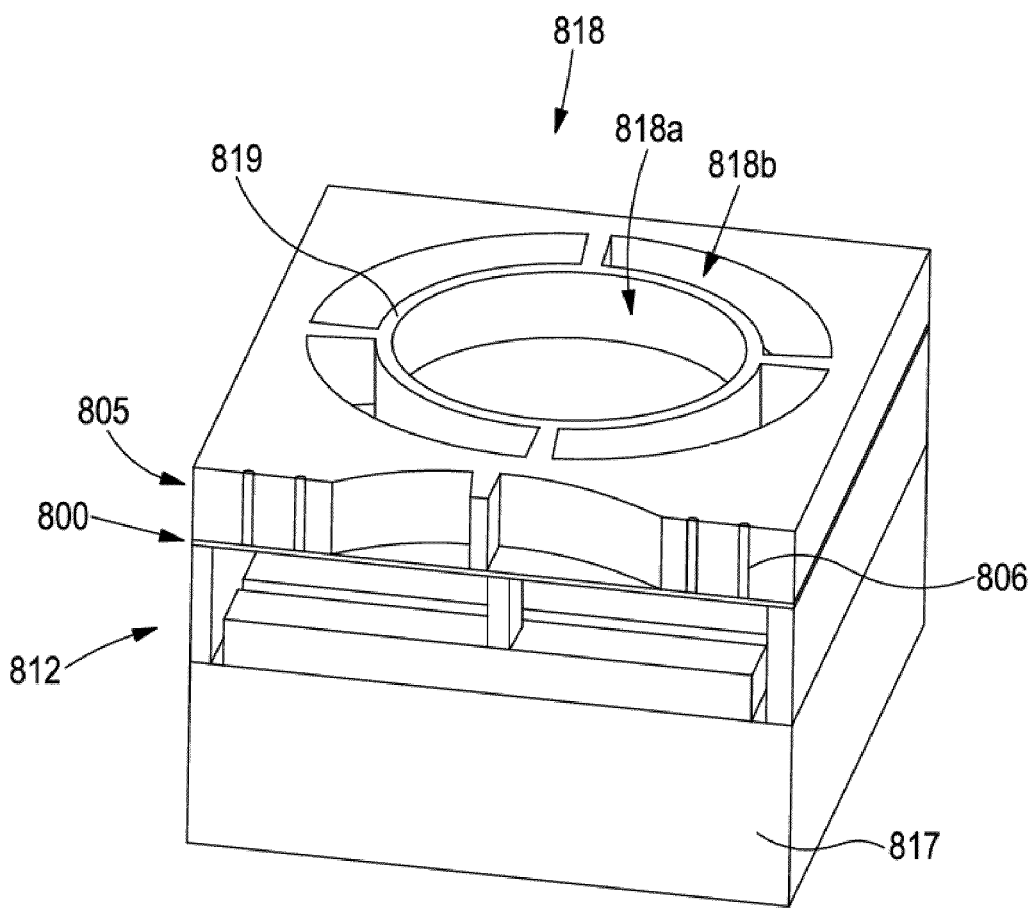
FIG. 8h depicts an eighth step in a method of forming a micromirror array.

In FIG. 8h, lithography and silicon etching is used to form cavities 818 in the second wafer 805 underneath the piezoelectric actuators and the heat sink. Note that in use an outer portion of the flexible membrane 314 (e.g. a portion radially outward of the grooves) is in contact with a wall 819. The wall 819 is between a cavity 818a in register with the heat sink and a cavity 818b in register with the piezoelectric actuators. The wall 819 is able conduct heat from the flexible membrane 314 to the substrate. The method then comprises etching a dielectric layer to reveal the piezoelectric actuators (i.e. to release the strip of flexible material), the sensing elements and dicing scribes.

Figure 8I:
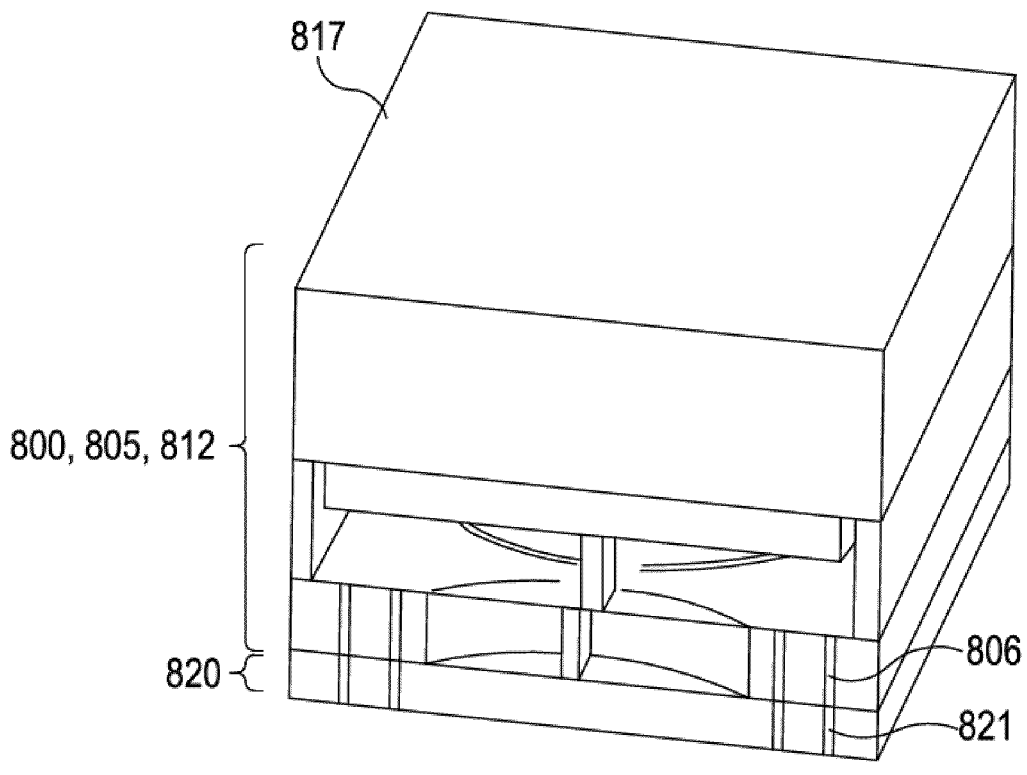
FIG. 8i depicts a ninth step in a method of forming a micromirror array.

As illustrated in FIG. 8i, the method further comprises providing a fourth silicon wafer 820 for sealing the second wafer 805. The fourth wafer 820 may be referred to as the "support wafer" 820 and comprises TSVs 821 for connecting to the second wafer 805. Bump bonding may be used to bond the fourth wafer 820 to the second wafer 805. An Al redistribution layer (RDL) and connection pads can be formed on the back of the fourth wafer 820.

Figure 8J:
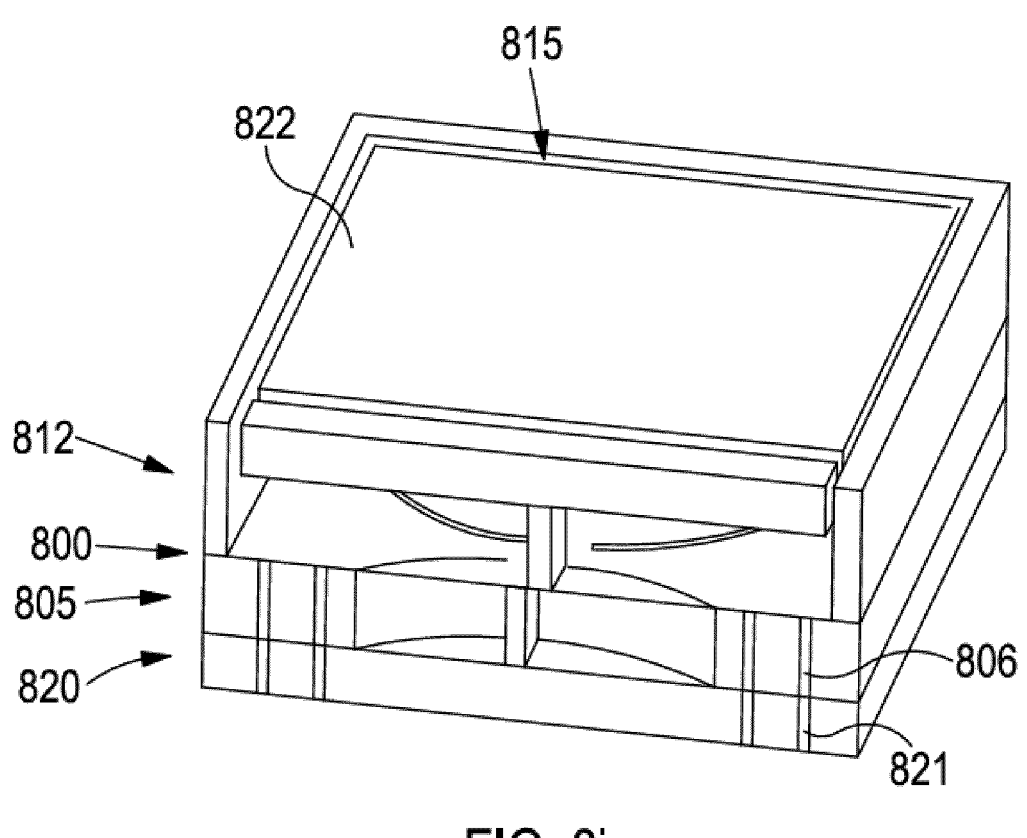
FIG. 8j depicts a tenth step in a method of forming a micromirror array.

In FIG. 8*j*, the mirror 822 is released by removing the front side handle wafer 817. A controller chip can be glued and wirebonded to the back of the fourth wafer 820.

Another embodiment of the invention comprises a lithographic apparatus LA, such as the lithographic apparatus LA of FIG. 1, configured for dark-field imaging as shown in FIG. 1*b*. A potential problem with this configuration of dark-field imaging is that for large patterns (i.e. patterns having a large pitch between features) the diffraction angle is small, and the first order diffractions (+1 and −1) may also fall within the opening 102, which can make imaging at the wafer level difficult.

To solve this problem, the patterning device comprises a first MEMS, which can be used to displace the surface of the patterning device to direct first order diffractions from the opening 102 to the mirror 101. The MEMS comprises a plurality of MEMS elements arranged under the multilayer reflector of the patterning device MA. Each MEMs element may comprise a displacement structure (e.g. a rectangle of silicon for tipping an tilting) supporting the multilayer reflector or may be directly bonded to the underside of the multilayer reflector.

Redirecting the diffracted radiation can distort the image, and the mirror 101 therefore comprises a second MEMS (such as a micromirror array) to compensate for the redirection by correcting the angle of the patterned beam. The second MEMS may be controlled through a feedback system, which uses the position of the patterning device MA (relative to the incident radiation beam) to determine the required correction of the mirror 101 and provide control signals to the second MEMS accordingly. The second MEMS is thereby dynamically updated throughout scanning. The required corrections for a given position of the patterning device MA can be determined in advance through simulations of the particular patterning device.

The mask on the multilayer reflector may comprise both features with large pitch (e.g. pitch of the order of 100 nm or more) and small pitch (e.g. pitch <10 nm), and the first and second MEMS are configured to be used only for features having a large pitch. For the other features, the diffraction angle is large enough to avoid the opening 102 in the mirror 101.

The local deformation required for any particular area of the patterning device can be pre-set in the first MEMS, since the features of the patterning device are fixed. The patterning device may be simulated to determine the required local deformation, which can then be used to set the displacements/positions of the MEMS elements of the first MEMS.

Figure 9A:
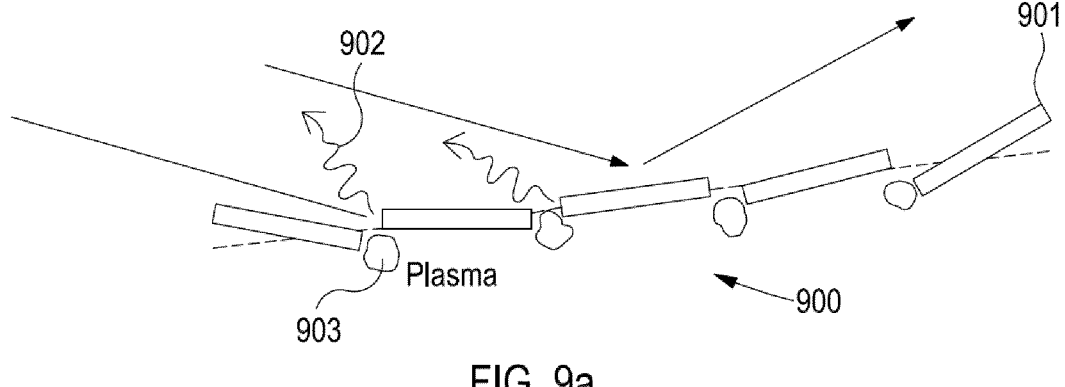
FIG. 9a depicts a grazing incidence mirror being a micromirror array.
Figure 9B:
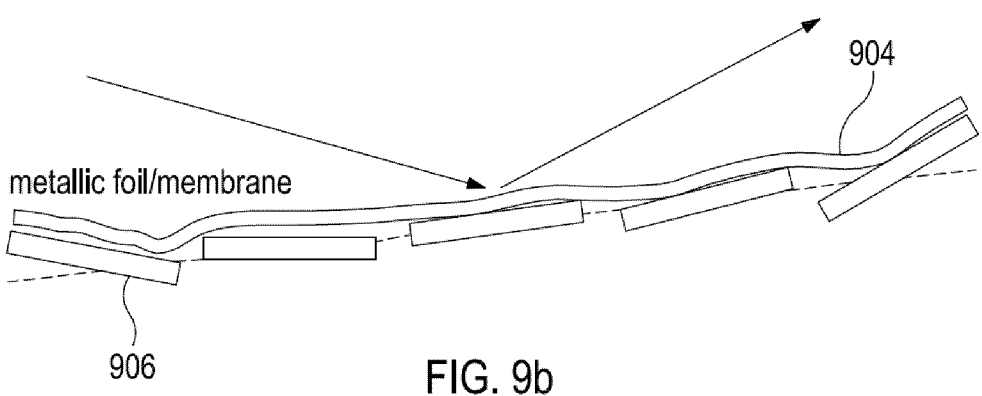
FIG. 9b depicts a grazing incidence mirror according to another embodiment.

FIGS. 9*a* and 9*b* show embodiments of the MEMS used in a grazing incidence mirror. For normal incidence, a multilayer reflector is normally required to reflect sufficient EUV, whereas for grazing incidence a single reflective layer or coating may be used.

In FIG. 9*a* a micromirror array 900 is used to reflect light at grazing incidence. However, the gaps between individual mirrors 901 in the array 900 can cause flares 902 from edge reflections and plasmas 903 to form.

FIG. 9*b* shows another embodiment of the grazing incidence mirror, wherein a continuous reflective layer being a metal foil 904 is located over the displacement structures 906 of the MEMS. By displacing the displacement structure 906, the foil 904 can be deformed to redirect incident light.

Figure 10:
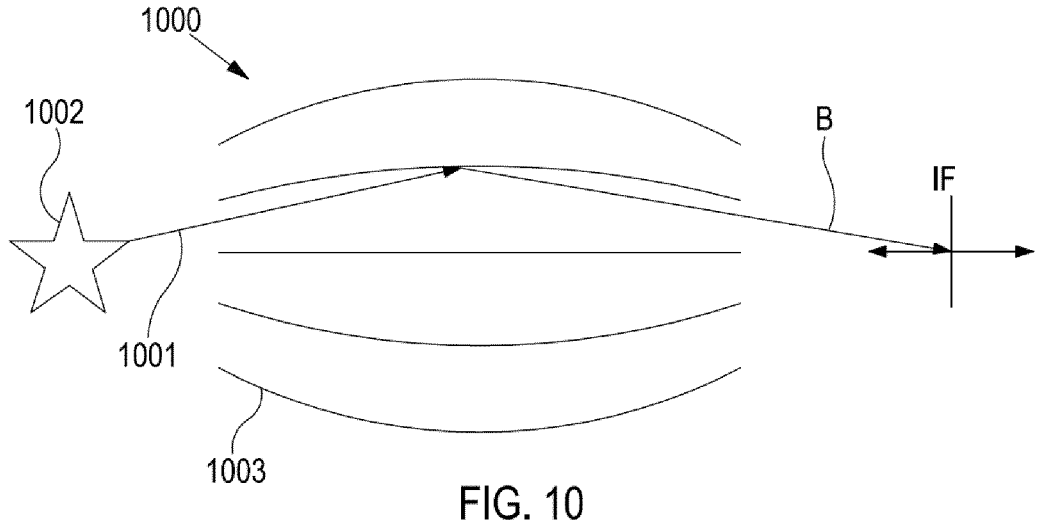
FIG. 10 depicts a grazing incidence collector according to an embodiment.

FIG. 10 shows a grazing-incidence collector 1000 for collecting light 1001 from a source 1002 to form a radiation beam B. The collector 1000 comprises a plurality of cylindrical grazing incidence mirrors 1003 for focusing incident light 1001 from the source 1002 towards an intermediate focus point IF. The grazing incidence mirrors may comprise MEMS as described herein in order to control the focus point of the radiation beam B.

Figure 11:
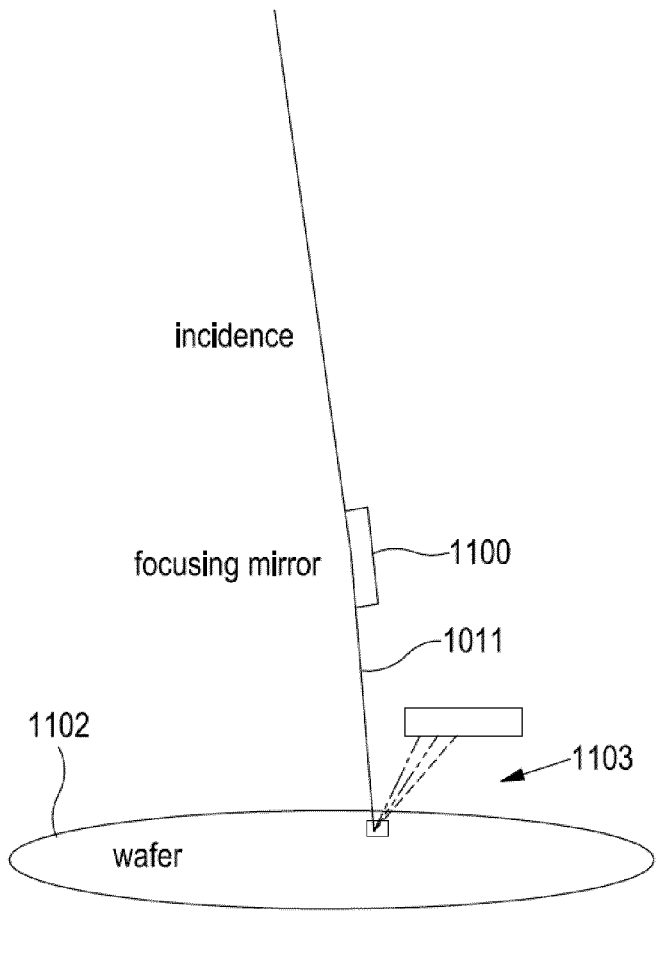
FIG. 11 depicts a part of an inspection and/or metrology apparatus comprising a grazing incidence mirror according to an embodiment.

FIG. 11 illustrates another embodiment of the grazing incidence mirror 1100, being a focus mirror in an inspection and/or metrology apparatus. The mirror 1100 can use the MEMS to change the point of focus of the light 1101 incident on the wafer or other substrate 1102. Light diffracted 1103 from the wafer or other substrate 1102 may be received and analyzed in order to determine features of the wafer or other substrate 1102.

Figure 12A:
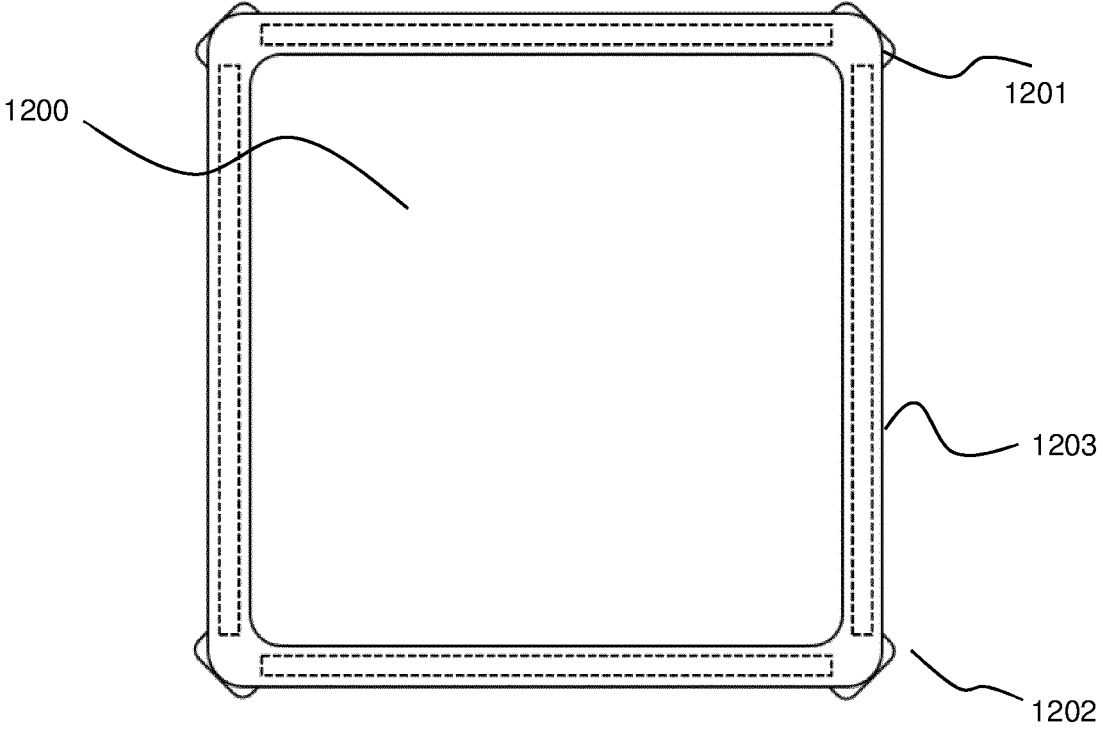
FIG. 12a depicts a schematic top view of a pellicle and pellicle frame according to an embodiment.
Figure 12B:
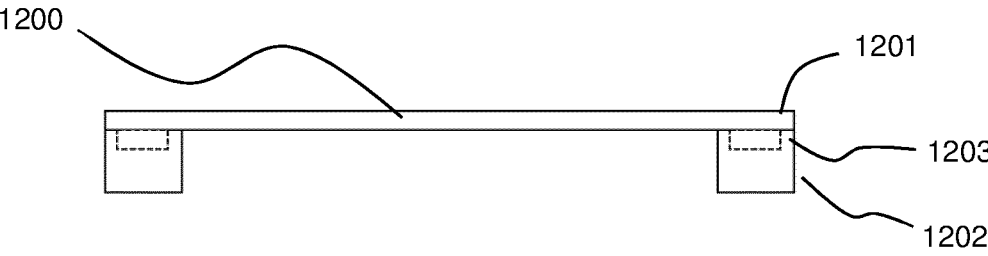
FIG. 12b shows a side view cross section of the pellicle and frame.

In another embodiment, the MEMS described herein is used in a pellicle frame, in order to control the stress in the pellicle over time. FIG. 12*a* shows a top view of a pellicle 1200 with a border 1201 supported by a frame 1202. The frame comprises a MEMS 1203 with an array of MEMS elements located in the dashed regions under the border 1201. Whilst FIG. 12*a* shows the MEMS 1203 extending under a part of the border 1201, in other embodiments the MEMS 1203 may cover the entire border 1201 of the pellicle 1200 or a different part. FIG. 12*b* shows a side cross-section of the pellicle 1200. The MEMS 1203 is located at the top of the frame so as to contact the border 1201 of the pellicle 1200. The pellicle 1200 may be part of a mask assembly such as the mask assembly 15 of FIG. 1. Active mechanical actuation from the MEMS elements is used to provide border deformation in order to apply stress to the pellicle 1200. The MEMS allows for continuous control of the pellicle border bending. A benefit of the MEMS device is that it can be controlled during operation, without requiring the mask assembly to be removed or disassembled. This means that if the pellicle film would lose, or gain, pre-stress due to a degradation process, this could be corrected for by increasing or decreasing the tilt of MEMS elements. For example, correction for a reduction of stress (which may be referred to as tension) of the pellicle 1200 may be applied by actuating the MEMS 1203 on one side, or opposite sides, of the pellicle. The actuation may move the MEMS 1203 outwards (i.e. away from an interior of the pellicle frame). Correction for a reduction of stress may be applied by actuating the MEMS 1203 on all sides of the pellicle 1200 (e.g. moving the MEMS outwards). In another example, a localized reduction of stress in the pellicle 1200 may occur (e.g. for half of the pellicle). Correction for this localized reduction of stress may be applied by actuating the MEMS 1203 on opposite sides of the area of localized stress reduction (or on one side of the area of localized stress reduction). In general, the MEMS may be actuated to correct for localized or global changes of stress of the pellicle. This may advantageously increase the lifetime of the pellicle.

In addition, the MEMS 1203 can be used to determine the level of stress in the pellicle for different areas of the pellicle. A feedback system can be used to control the MEMS elements to locally compensate for any changes in the stress. In this way automated control of the stress of the pellicle 1200 may be provided.

Full tip and tilt displacements may not be required for the pellicle, since the MEMS is only used to apply stress to the pellicle. As such, MEMS elements having tilt control in only one dimension may be used in the pellicle frame. This can simplify the fabrication and control system of the MEMS.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A microelectromechanical system, MEMS, comprising:
a substrate;
a plurality of MEMS elements supported from the substrate;
a control system arranged to receive a control signal and to generate one or more actuator control signals; and
for each MEMS element of the plurality of MEMS elements,
(i) one or more piezoelectric actuators, each piezoelectric actuator is arranged to receive at least one of the actuator control signals and accordingly displace the corresponding MEMS element relative to the substrate,
(ii) at least one piezoresistor sensing element for generating an analogue sensor signal indicative of displacement of the MEMS element, and
(iii) a temperature sensor for generating an analogue temperature signal indicative of the temperature of the piezoresistor sensing element;
wherein the control system is configured to:
(i) use the analogue sensor signals and the analogue temperature signals respectively to generate corresponding digital sensor signals and corresponding digital temperature signals,
(ii) calculate target actuator control voltages using the received control signal, the digital sensor signals and digital temperature signals; whereby calculating the target actuator control voltages includes calculating an estimated strain in the temperature sensor, and correcting a temperature value indicated by the temperature signal for dependence on strain in the temperature sensor using the estimated strain; and
(iii) to generate the actuator control signals based on the calculated target actuator control voltages.

2. The microelectromechanical system, MEMS, of claim 1, wherein the control system is configured to calculate each target actuator control voltage by determining the value of a predetermined function of the received control signal, the corresponding digital sensor signal and corresponding digital temperature signal.

3. The microelectromechanical system, MEMS, of claim 2, wherein the predetermined function includes a term that has second order dependence on the digital temperature signal and/or a term that has third order dependence on the digital temperature signal.

4. The microelectromechanical system, MEMS, of claim 1, wherein calculating the target actuator control voltages includes calculating an estimated temperature value of the piezoresistor sensing element, and correcting a strain value indicated by the sensor signal to compensate for temperature in the piezoresistor sensing element using the estimated temperature value.

5. The microelectromechanical system, MEMS, of claim 1, wherein the control system comprises:

an electrical bridge element including two voltage supply terminals maintained at different respective voltages, input and output terminals, and multiple resistors connected between corresponding pairs of the terminals,
an analogue-to-digital converter, and
a signal path that transmits the sensor signal generated by the piezoresistor sensing element to an input terminal of the electrical bridge element, and a signal path to transmit a modified sensor signal from the electrical bridge element to the analogue-to-digital converter,
the analogue-to-digital converter is operative to generate the digital sensor signal by digitizing the modified sensor signal.

6. The microelectromechanical system, MEMS, of claim 5, wherein the electrical bridge element further comprises at least one bridge temperature sensor arranged to generate a bridge temperature signal indicative of the temperature of at least one of the resistors, the at least one bridge temperature signal is converted to a digital bridge temperature signal by the analogue-to-digital converter, and used in the calculation of the target actuator control voltages.

7. The microelectromechanical system, MEMS, of claim 5, wherein the analogue-to-digital converter is provided in a control unit proximate the actuator, and the control system further comprises at least one controller unit mounted on the substrate and arranged to calculate the target actuator control voltages.

8. The microelectromechanical system, MEMS, of claim 1, wherein the temperature sensor comprises a bipolar transistor located on the actuator, a base and a collector of the bipolar transistor is electrically connected whereby the bipolar transistor operates as a diode.

9. The microelectromechanical system, MEMS, of claim 1, wherein the piezoresistor sensing element is a folded piezoresistor enclosing the temperature sensor.

10. The microelectromechanical system, MEMS, of claim 1, further comprising, for each MEMS element of the plurality of MEMS elements, a heat diffuser for diffusing heat from the MEMS element, the heat diffuser comprising a heat sink and a thermally conductive post connecting the heat sink to the MEMS element.

11. The microelectromechanical system, MEMS, of claim 1, wherein the MEMS is a micromirror array and, wherein each MEMS element of the plurality of MEMS elements is associated with a mirror for reflecting incident light.

12. The microelectromechanical system, MEMS, of claim 11, wherein, for each mirror, one of the piezoelectric actuators comprises at least one layer of piezoelectric material provided on a strip of flexible material and a plurality of electrodes for supplying control signals generated by the control system to the at least one layer of piezoelectric material.

13. An programmable illuminator comprising a micromechanical system, MEMS, of claim 11, for conditioning a radiation beam.

14. An inspection or metrology apparatus, comprising a programmable illuminator of claim 13, for conditioning a radiation beam used to measure a target structure on a substrate.

15. A lithographic apparatus arranged to project a pattern from a patterning device onto a substrate comprising a programmable illuminator of claim 13, for conditioning a radiation beam used to illuminate the patterning device and/or for conditioning a radiation beam used to measure a target structure on the substrate.

* * * * *